United States Patent
Hayashishita

(10) Patent No.: US 9,475,962 B2
(45) Date of Patent: Oct. 25, 2016

(54) PRODUCTION METHOD FOR LAMINATE FILM, LAMINATE FILM, AND PRODUCTION METHOD FOR SEMICONDUCTOR DEVICE EMPLOYING SAME

(71) Applicant: MITSUI CHEMICALS TOHCELLO, INC., Chiyoda-ku, Tokyo (JP)

(72) Inventor: Eiji Hayashishita, Nagoya (JP)

(73) Assignee: MITSUI CHEMICALS TOHCELLO, INC., Tokyo (JP)

(*) Notice: Subject to any disclaimer, the term of this patent is extended or adjusted under 35 U.S.C. 154(b) by 0 days.

(21) Appl. No.: 14/780,092

(22) PCT Filed: Mar. 25, 2014

(86) PCT No.: PCT/JP2014/001710
§ 371 (c)(1),
(2) Date: Sep. 25, 2015

(87) PCT Pub. No.: WO2014/156127
PCT Pub. Date: Oct. 2, 2014

(65) Prior Publication Data
US 2016/0053137 A1 Feb. 25, 2016

(30) Foreign Application Priority Data
Mar. 26, 2013 (JP) ................................. 2013-064553

(51) Int. Cl.
*H01L 21/46* (2006.01)
*C09J 7/02* (2006.01)
(Continued)

(52) U.S. Cl.
CPC ................ *C09J 7/0235* (2013.01); *C09J 7/02* (2013.01); *C09J 123/142* (2013.01);
(Continued)

(58) Field of Classification Search
CPC .. H01L 21/6836; H01L 21/78; C09J 7/0235; C09J 7/02; C09J 123/20
USPC .................................. 438/464, 455, 458, 459
See application file for complete search history.

(56) References Cited

U.S. PATENT DOCUMENTS 8,465,615 B2 * 6/2013 Tanaka ........................ C09J 7/02
156/247
8,470,115 B2 * 6/2013 Tanaka ........................ C09J 7/02
156/247

(Continued)

FOREIGN PATENT DOCUMENTS

JP 3021645 U 2/1996
JP 2001-096494 A 4/2001

(Continued)

OTHER PUBLICATIONS

International Search Report (PCT/ISA/210) mailed on Jul. 1, 2014, by the Japanese Patent Office as the International Searching Authority for International Application No. PCT/JP2014/001710.

*Primary Examiner* — Kevin M Picardat
(74) *Attorney, Agent, or Firm* — Buchanan, Ingersoll & Rooney PC

(57) ABSTRACT

Provided is a manufacture method of a laminate film accurately precut into a desired shape. The manufactured laminate film comprises an elongated release film having thereon a plurality of insular adhesive films (A) and (B) mutually adjacent in the lengthwise direction, and the method includes: obtaining an elongated laminate having a release film and an adhesive film; precutting the adhesive film to obtain a first peeling part; and peeling off the first peeling part from the release film. The first peeling part includes peripheral parts (A1) and (B2) of insular adhesive films (A) and (B) respectively positioned at one and the other widthwise end side of the release film; and connection part (C) connecting peripheral parts (A1) and (B2), but not including peripheral parts (A2) and (B1) of insular adhesive films (A) and (B) respectively positioned at the other and the one widthwise end side of the release film.

24 Claims, 15 Drawing Sheets

(51) Int. Cl.
*H01L 21/683* (2006.01)
*C09J 123/14* (2006.01)
*C09J 123/20* (2006.01)
*H01L 21/78* (2006.01)

(52) U.S. Cl.
CPC ........ *C09J 123/20* (2013.01); *H01L 21/6836* (2013.01); *H01L 21/78* (2013.01); *C09J 2201/28* (2013.01); *C09J 2203/326* (2013.01); *H01L 2221/68327* (2013.01)

(56) References Cited

U.S. PATENT DOCUMENTS

2004/0009650 A1* 1/2004 Jeong ................ H01L 21/67132
438/462
2011/0139347 A1* 6/2011 Kim ...................... C09J 7/0246
156/154
2012/0309170 A1 12/2012 Hayashishita et al.
2015/0017375 A1* 1/2015 Aoyama ............. H01L 21/6836
428/41.8

FOREIGN PATENT DOCUMENTS

| | | |
|---|---|---|
| JP | 2004-115591 A | 4/2004 |
| JP | 2005-255909 A | 9/2005 |
| JP | 2007-002173 A | 1/2007 |
| JP | 2009-188323 A | 8/2009 |
| JP | 2010-192856 A | 9/2010 |
| JP | 4945014 B1 | 6/2012 |
| JP | 2013-001774 A | 1/2013 |
| WO | WO 2012/042869 A1 | 4/2012 |

* cited by examiner

PRODUCTION METHOD FOR LAMINATE FILM, LAMINATE FILM, AND PRODUCTION METHOD FOR SEMICONDUCTOR DEVICE EMPLOYING SAME

TECHNICAL FIELD

The present invention relates to a method of manufacturing a laminate film, a laminate film, and a method of manufacturing a semiconductor device using the same.

BACKGROUND ART

When cutting and separating (dicing) a semiconductor wafer into individual chips, a dicing film for fixing the semiconductor wafer, or a dicing die bonding film in which a dicing film and a die bonding film are integrated has been used.

Such a dicing film and a dicing die bonding film may at times be subjected to a precut processing to match the shape of a ring frame so as to enhance the operability of the film, for example, during adhesion to the wafer, and attachment to the ring frame when dicing (see, e.g., PTLs 1 to 4).

An example of a conventional dicing die boding film having undergone the precut processing is illustrated in FIGS. 13A and 13B. FIG. 13A is a plan view of the conventional dicing die bonding film, and FIG. 13B is a sectional view taken along line B-B in FIG. 13A. Dicing die bonding film 60 is composed of release film 61, adhesive layer 62 and adhesive film 63. Adhesive layer 62 has a circular shape corresponding to the shape of a wafer. Adhesive film 63 has a circular label part 63a corresponding to the shape of the ring frame for dicing, and a pair of side parts 63b provided continuously along the lengthwise direction of release film 61 while surrounding the exterior of the circular label part 63a. Dicing die bonding film 60 having undergone the precut processing is typically wound up into a roll to be provided as a rolled product, as illustrated in FIG. 14. The pair of side parts 63b has a function of inhibiting the transfer of roll wrinkles or the like to the surface of flexible adhesive layer 62 when dicing die bonding film 60 is wound up into a roll.

Such a dicing die bonding film may be manufactured as set forth below. First, a laminate (not illustrated) having release film 61, a plurality of circular adhesive layers 62, and adhesive film 63 is provided (see FIG. 15A). Then, a precut step is conducted for punching out adhesive film 63 into a predetermined shape (see FIG. 15B).

In the precut step, a precutting blade tool 71, having on its surface a blade pattern corresponding to the shape of an area to be peeled off as an unnecessary part, is set on magnet cylinder 70, and revolving magnet cylinder 70 is pressed against adhesive film 63 fed at a predetermined speed. Thus, one sheet of adhesive film 63 is punched out into a predetermined shape per revolution of magnet cylinder 70, thereby continuously precutting adhesive film 63. Then, an unnecessary part of adhesive film 63 is peeled off and removed to obtain a dicing die bonding film having a plurality of circular label parts 63a and a pair of side parts 63b.

CITATION LIST

Patent Literature

PTL 1
Japanese Patent Application Laid-Open No. 2001-96494
PTL 2
Japanese Patent Application Laid-Open No. 2007-2173
PTL 3
Japanese Patent Application Laid-Open No. 2010-192856

SUMMARY OF INVENTION

Technical Problem

In order to facilitate the attachment of the precut adhesive film to a wafer, it is effective to enable an easy peeling off of the adhesive film from the release film, more specifically to lower the adhesiveness between the release film and the adhesive film. However, when the adhesiveness between the release film and the adhesive film is lowered, there is a problem such that precise peeling off of only a part to be peeled off becomes difficult, and that the precut processability is likely to be lowered.

That is, as illustrated in FIG. 16, conventional peeling part 75 includes outer peripheral part 75a of insular adhesive film A, outer peripheral part 75b of insular adhesive film B, and connection part 75c connecting these parts in the lengthwise direction of the release film (hatched part). Therefore, as illustrated in FIG. 16, when an attempt is made to peel off sequentially outer peripheral part 75a of insular adhesive film A, connection part 75c, and outer peripheral part 75b of insular adhesive film B along the lengthwise direction of the release film, peeling tension is less likely to be applied to a cut part (solid line part) of area X of peeling part 75 which is around the downstream end in the peeling direction of insular adhesive film A, and sometimes insular adhesive film A is peeled off together with peeling part 75.

In view of these problems, the present inventors have devised the shape of the peeling part, and found that even when the adhesiveness between the release film and the adhesive film is low, it is possible to precisely peel off only a part that should be peeled off.

The present invention has been achieved in light of the above-mentioned circumstances, and has an object of providing a method of manufacturing a laminate film which is precut processed precisely into a predetermined shape.

Solution to Problem

[1] A method of manufacturing a laminate film containing an elongated release film and a plurality of insular adhesive films, the insular adhesive film being either an insular adhesive film A or an insular adhesive film B which is adjacent to each other on the release film along a lengthwise direction thereof, the method including: obtaining an elongated laminate containing the elongated release film and an elongated adhesive film, precutting the adhesive film in the laminate to thereby obtain a first peeling part surrounded by a cut line, and peeling off the first peeling part from the release film, in which the first peeling part includes a peripheral part A1 of the insular adhesive film A at one widthwise end side of the release film, a peripheral part B2 of the insular adhesive film B at the other widthwise end side of the release film and a connection part C connecting the peripheral part A1 and the peripheral part B2, but does not include a peripheral part A2 of the insular adhesive film A at the other widthwise end side of the release film and a peripheral part B1 of the insular adhesive film B at the one widthwise end side of the release film, or alternatively the first peeling part includes the peripheral part A1 of the insular adhesive film A at the one widthwise end side of the release film, the peripheral part B1 of the insular adhesive film B at the one widthwise end side of the release film and a connection part C connecting the peripheral part A1 and the peripheral part B1, but does not include the peripheral part A2 of the insular adhesive film A at the other widthwise end side of the release film and the peripheral part B2 of the insular adhesive film B at the other widthwise end side of the release film.

[2] The method of manufacturing a laminate film according to [1], in which the first peeling part includes a peripheral part A1 of the insular adhesive film A at one widthwise end side of the release film, a peripheral part B2 of the insular adhesive film B at the other widthwise end side of the release film and the connection part C connecting the peripheral part A1 and the peripheral part B2, but does not include the peripheral part A2 of the insular adhesive film A at the other widthwise end side of the release film and the peripheral part B1 of the insular adhesive film B at the other widthwise end side of the release film.

[3] The method of manufacturing a laminate film according to [2], in which the first peeling part is peeled off along the lengthwise direction of the release film in an order of the peripheral part A1, the connection part C and the peripheral part B2, and the connection part C constituting the first peeling part is in contact with the insular adhesive film A at a lower end thereof in the peeling direction of the peeling part.

[4] The method of manufacturing a laminate film according to [2] or [3], in which the connection part C extends in an oblique direction relative to the lengthwise direction of the release film.

[5] The method of manufacturing a laminate film according to any one of [1] to [4], in which a line connecting centers of the insular adhesive films is parallel to the lengthwise direction of the release film.

[6] The method of manufacturing a laminate film according to [2], [3] or [4], further including: precutting the adhesive film in the laminate to thereby obtain a second peeling part surrounded by a cut line, and peeling off the second peeling part from the release film, in which the second peeling part is provided at the other widthwise end side of the release film as defined for the first peeling part, and includes a peripheral part A2 of the insular adhesive film A at the other widthwise end side of the release film, an outer peripheral part B2' provided adjacent to the outer periphery of a peripheral part B2 of the insular adhesive film B at the other widthwise end side of the release film and a connection part C2 connecting the peripheral part A2 and the outer peripheral part B2'.

[7] The method of manufacturing a laminate film according to [2], [3], [4] or [6], further including: precutting the adhesive film in the laminate to thereby obtain a third peeling part surrounded by a cut line, and peeling off the third peeling part from the release film, in which the third peeling part is provided at the one widthwise end side of the release film as defined for the first peeling part, and includes an outer peripheral part A1' provided adjacent to the outer periphery of a peripheral part A1 of the insular adhesive film A at the one widthwise end side of the release film, a peripheral part B1 of the insular adhesive film B at the one widthwise end side of the release film and a connection part C1 connecting the outer peripheral part A1' and the peripheral part B1.

[8] The method of manufacturing a laminate film according to any one of [1] to [7], in which the insular adhesive film has a circular shape.

[9] The method of manufacturing a laminate film according to any one of [1] to [8], in which the laminate film further includes a side part which is surrounding an outer periphery of the plurality of insular adhesive films and which is provided continuously along the lengthwise direction of the release film.

[10] The method of manufacturing a laminate film according to any one of [1] to [9], in which a peel strength between the release film and the insular adhesive film is 1 to 35 g/50 mm.

[11] The method of manufacturing a laminate film according to any one of [1] to [10], in which the insular adhesive film is for attaching to a semiconductor wafer.

[12] The method of manufacturing a laminate film according to any one of [1] to [11], in which the insular adhesive film contains an expandable substrate layer which contains: a 1-butene.α-olefin copolymer (A) having a tensile elasticity of 100 to 500 MPa at 23° C.; and a propylene-based elastomer composition (B) containing a propylene.α-olefin copolymer (b1) and having a tensile elasticity of 8 to 500 MPa at 23° C., the content of the propylene-based elastomer composition (B) is 30 to 70 parts by weight based on 100 parts by weight of the total of the 1-butene.α-olefin copolymer (A) and the propylene-based elastomer composition (B).

[13] The method of manufacturing a laminate film according to any one of [1] to [12], in which the insular adhesive film further contains an adhesive layer provided on a surface which is in contact with the release film, and adhesive force of the adhesive layer measured in accordance with JIS Z0237 is 0.1 to 10 N/25 mm, the measurement being made by attaching the adhesive layer to a surface of a SUS-304-BA plate, allowing to stand still for 60 minutes and peeling off the adhesive layer from the surface of the SUS-304-BA plate.

[14] A laminate film containing an elongated release film, and a plurality of insular adhesive films, the insular adhesive film being either an insular adhesive film A or an insular adhesive film B which is adjacent to each other on the release film along a lengthwise direction thereof, the laminate film further including an exposed part of the release film which is provided between the insular adhesive film A and the insular adhesive film B, in which the exposed part of the release film extends in an oblique direction relative to the lengthwise direction of the release film.

[15] A laminate film containing an elongated release film, and a plurality of insular adhesive films, the insular adhesive film being either an insular adhesive film A or an insular adhesive film B which is adjacent to each other on the release film along a lengthwise direction thereof, the laminate film further including an exposed part of the release film which is provided between the insular adhesive film A and the insular adhesive film B, in which a surface of the exposed part of the release film has a cut mark extending in an oblique direction relative to the lengthwise direction of the release film.

[16] The laminate film according to [14] or [15], in which the exposed part is in contact with at least one or both of one end of the insular adhesive film A in the lengthwise direction of the release film and the other end of the insular adhesive film B in the lengthwise direction of the release film.

[17] The laminate film according to any one of [14] to [16], in which a line connecting centers of the insular adhesive films is parallel to the lengthwise direction of the release film.

[18] The laminate film according to any one of [14] to [17], in which the insular adhesive film has a circular shape.

[19] The laminate film according to any one of [14] to [18], in which a peel strength between the release film and the insular adhesive film is 1 to 35 g/50 mm.

[20] The laminate film according to any one of [14] to [19], in which the insular adhesive film is for attaching to a semiconductor wafer.

[21] The laminate film according to any one of [14] to [20], in which the insular adhesive film contains an expandable substrate layer which contains. a 1-butene.α-olefin copolymer (A) having a tensile elasticity of 100 to 500 MPa at 23° C.; and a propylene-based elastomer composition (B) containing a propylene.α-olefin copolymer (b1) and having a tensile elasticity of 8 to 500 MPa at 23° C., and the content of the propylene-based elastomer composition (B) is 30 to 70 parts by weight based on 100 parts by weight of the total of the 1-butene.α-olefin copolymer (A) and the propylene-based elastomer composition (B).

[22] The laminate film according to any one of [14] to [21], in which the insular adhesive film further contains an adhesive layer on a surface which is in contact with the release film, and adhesive force of the adhesive layer measured in accordance with JIS Z0237 is 0.1 to 10 N/25 mm, the measurement being made by attaching the adhesive layer to a surface of a SUS-304-BA plate, allowing to stand still for 60 minutes and peeling off the adhesive layer from the surface of the SUS-304-BA plate.

[23] A method of manufacturing a semiconductor device, including: peeling off at least a part of a release film from the laminate film according to any one of [14] to [22] to thereby obtain an insular adhesive film having at least one exposed part thereof; and attaching the insular adhesive film having at least one exposed part thereof to a semiconductor wafer.

[24] The method of manufacturing a semiconductor device according to [23], further including: dicing the semiconductor wafer to obtain a semiconductor chip; and picking up the semiconductor chip by expanding the insular adhesive film.

Advantageous Effects of Invention

According to the present invention, it is possible to provide a method of manufacturing a laminate film which is precut processed precisely into a predetermined shape.

DESCRIPTION OF EMBODIMENTS

1. Laminate Film

The elongated laminate film of the present invention contains an elongated release film, and a plurality of insular adhesive films provided thereon, and, as necessary, may further contain a pair of side parts provided outside the plurality of insular adhesive films. The elongated laminate film of the present invention is obtained by the method of manufacturing the laminate film described hereinafter.

The plurality of insular adhesive films are provided at predetermined intervals in the lengthwise direction of the release film, and is either insular adhesive film A or B which is adjacent to each other. The line connecting the centers of the plurality of insular adhesive films (line connecting a center to the next center) is preferably parallel to the lengthwise direction of the release film.

The shape of the insular adhesive film is not particularly limited, and may be, for example, circular or rectangular; and when the insular adhesive film is used as a dicing film for a semiconductor wafer, the insular adhesive is preferably circular.

First Embodiment

Figure 1A:
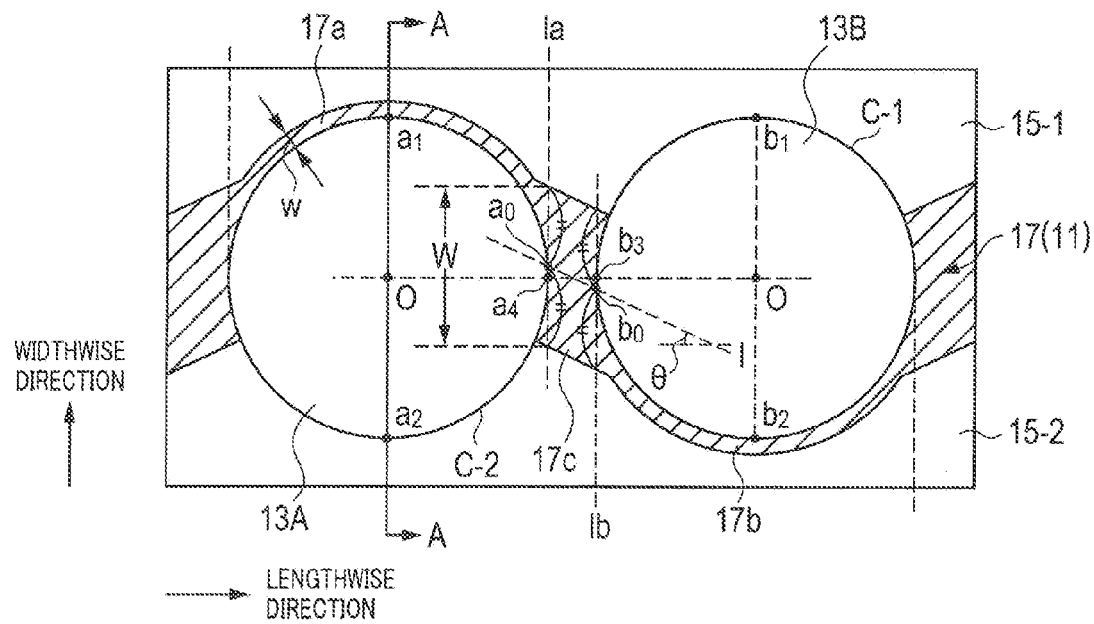
FIG. 1A is a plan view illustrating a first embodiment of an elongated laminate film of the present invention.
Figure 1B:
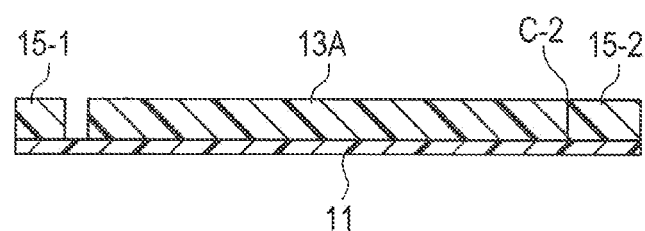
FIG. 1B is a sectional view taken along line A-A in FIG. 1A.

FIG. 1A is a plan view illustrating the first embodiment of the elongated laminate film of the present invention. FIG. 1B is a sectional view taken along line A-A in FIG. 1A. As illustrated in FIG. 1A, elongated laminate film 10 contains elongated release film 11, a plurality of insular adhesive films 13A and 13B provided thereon, and a pair of side parts 15-1 and 15-2 surrounding the exterior of insular adhesive films 13A and 13B and being provided along the lengthwise direction of release film 11.

The material for release film 11 may be paper, or a film of synthetic resin such as polyethylene, polypropylene, or polyethylene terephthalate. The thickness of release film 11 is typically about 10 to 200 µm, and preferably 25 to 100 µm.

Insular adhesive films 13A and 13B may function as a dicing film to be attached to a semiconductor wafer. Therefore, insular adhesive films 13A and 13B may have a shape corresponding to a ring frame surrounding the semiconductor wafer, i.e., a circular shape. The diameters of insular adhesive films 13A and 13B are also set approximately equal to the outer diameter of the ring frame, and, for example, may be set at about 6 to 12 inches (about 210 to 370 mm).

Insular adhesive films 13A and 13B are provided at predetermined intervals along the lengthwise direction (MD direction) of the release film. The line connecting the centers of insular adhesive films 13A and 13B is preferably parallel to the lengthwise direction of release film 11.

Insular adhesive films 13A and 13B contain at least a substrate layer having expandability, and may further contain other layers as necessary. The materials for constituting insular adhesive films 13A and 13B and the layer structure thereof will be described hereinafter.

The pair of side parts 15-1 and 15-2 surrounds the exterior of insular adhesive films 13A and 13B, and is provided along the lengthwise direction of release film 11. The pair of side parts 15-1 and 15-2 may have the same layer structure as that of insular adhesive films 13A and 13B. When the thickness at the widthwise end part of the laminate film is the same as the thickness of the insular adhesive film part, the pair of side parts 15-1 and 15-2 may inhibit the occurrence of roll wrinkles at the time of winding up of the laminate film into a rolled.

Between insular adhesive films 13A and 13B and the pair of side parts 15-1 and 15-2 is provided exposed part 17 (hatched part) of continuously provided release film 11.

Exposed part 17 includes exposed part 17a formed between insular adhesive film 13A and one side part 15-1, exposed part 17b of release film 11 formed between insular adhesive film 13B and the other side part 15-2, and exposed part 17c connecting exposed part 17a and exposed part 17b.

Exposed part 17c includes one or both of apexes a4 and b3, apex a4 being an apex of insular adhesive film 13A in the lengthwise direction of release film 11 (one end of insular adhesive film 13A in the lengthwise direction of release film 11) and apex b3 being an apex of insular adhesive film 13B in the lengthwise direction of release film 11 (the other end of insular adhesive film 13B in the lengthwise direction of release film 11).

In addition, exposed part 17c extends in the oblique direction relative to the lengthwise direction of release film 11. The angle θ formed between the direction in which exposed part 17c extends and the lengthwise direction of release film 11 may be preferably more than 0° and 80° or less, more preferably more than 0° and 75° or less, and even more preferably 15° or more and 70° or less.

The "direction in which exposed part 17c extends" is indicated by center line 1 connecting "middle point ao on tangent 1a (tangent to apex a4), of insular adhesive film 13A, parallel to the widthwise direction of the release film" and "middle point bo on tangent 1b (tangent to apex b3), of insular adhesive film 13B, parallel to the widthwise direction of the release film."

The "middle point ao on tangent 1a" means a middle point of "line segment of tangent 1a divided by two outer peripheral lines or their extended lines (extending in the lengthwise direction of the release film) constituting exposed part 17c." Likewise, the "middle point bo on tangent 1b" means a middle point of "line segment of tangent 1b divided by two outer peripheral lines or their extended lines (extending in the lengthwise direction of the release film) constituting exposed part 17c."

One exposed part 17c and the other exposed part 17c which are adjacent to each other extend in opposite directions.

The shape of exposed part 17 corresponds to the shape of first peeling part 37 in FIG. 8 described hereinafter. Specifically, exposed 17a corresponds to peripheral part 37A1 constituting first peeling part 37 in FIG. 8 described hereinafter; exposed part 17b corresponds to peripheral part 37B2 constituting first peeling part 37 in FIG. 8 described hereinafter; and exposed part 17c corresponds to peripheral part 37C constituting first peeling part 37 in FIG. 8 described hereinafter.

That is, width w of each of exposed parts 17a and 17b are the same as width w of each of peripheral part 37A1 and peripheral part 37B2 in FIG. 8 described hereinafter; and width W of exposed part 17c is the same as width W of connection part 37C in FIG. 8 described hereinafter.

On the other hand, insular adhesive film 13A and the other side part 15-2 are separated from each other by cut part C-2. Likewise, insular adhesive film 13B and one side part 15-1 are separated from each other by cut part C-1.

Figure 2A:
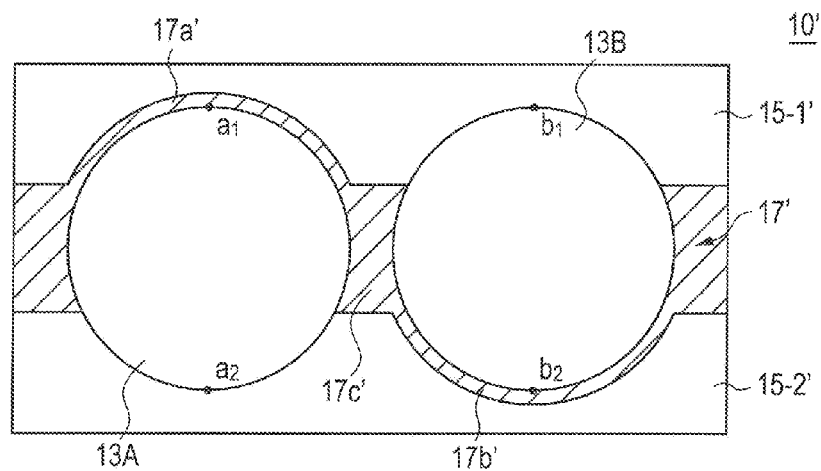
FIG. 2A is a plan view illustrating a modification of the first embodiment of the elongated laminate film of the present invention.
Figure 2B:
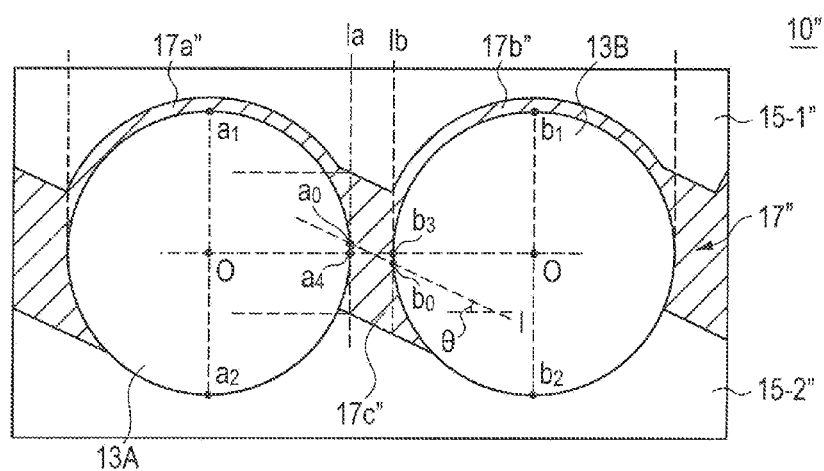
FIG. 2B is a plan view illustrating another modification of the first embodiment of the elongated laminate film of the present invention.
Figure 2C:
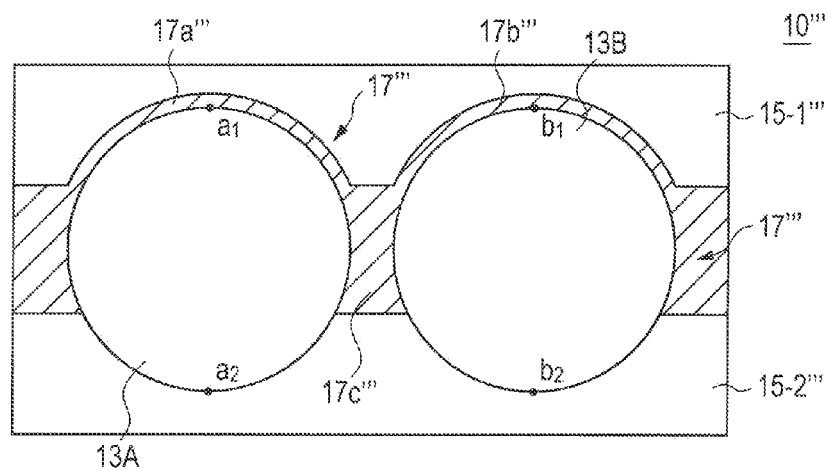
FIG. 2C is a plan view illustrating another modification of the first embodiment of the elongated laminate film of the present invention.

The shape of exposed part 17 is not limited to the shape illustrated in FIG. 1A, and may assume various shapes (see, e.g., FIGS. 2A to 2C).

FIG. 2A is a plan view illustrating the modification of the first embodiment of the elongated laminate film of the present invention. As illustrated in FIG. 2A, elongated laminate film 10' is configured approximately the same as in FIG. 1A except that exposed part 17c' extends parallel to the lengthwise direction of release film 11.

FIG. 2B is a plan view illustrating another modification of the first embodiment of the elongated laminate film of the present invention. As illustrated in FIG. 2B, elongated laminate film 10" is configured approximately the same as in FIG. 1A except that exposed part 17b" is formed between insular adhesive film 13B and one side part 15-1", in place of exposed part 17b formed between insular adhesive film 13B and the other side part 15-2 in FIG. 1A.

That is, exposed part 17" includes exposed part 17a" formed between insular adhesive film 13A and one side part 15-1", exposed part 17b", of release film 11, formed between insular adhesive film 13B and one side part 15-1", and exposed part 17c" connecting exposed part 17a" and exposed part 17b".

Exposed part 17c" includes one or both of apex a4 and apex b3, apex 4a being an apex of insular adhesive film 13A in the lengthwise direction of release film 11 (one end of insular adhesive film 13A in the lengthwise direction of release film 11) and apex b3 being an apex of insular adhesive film 13B in the lengthwise direction of release film 11 (the other end of insular adhesive film 13B in the lengthwise direction of release film 11).

In addition, exposed part 17c" extends in the oblique direction relative to the lengthwise direction of release film 11. The angle θ formed between the direction in which exposed part 17c" extends and the lengthwise direction of release film 11 may be the same as in FIG. 1A. However, unlike in FIG. 1A, one exposed part 17c" and the other exposed part 17c" which are adjacent to each other extend in the same direction.

FIG. 2C is a plan view illustrating another modification of the first embodiment of the elongated laminate film of the present invention. As illustrated in FIG. 2C, elongated laminate film 10''' is configured approximately the same as in FIG. 2B except that exposed part 17c''' extends parallel to the lengthwise direction of release film 11.

Second Embodiment 1

Figure 3A:
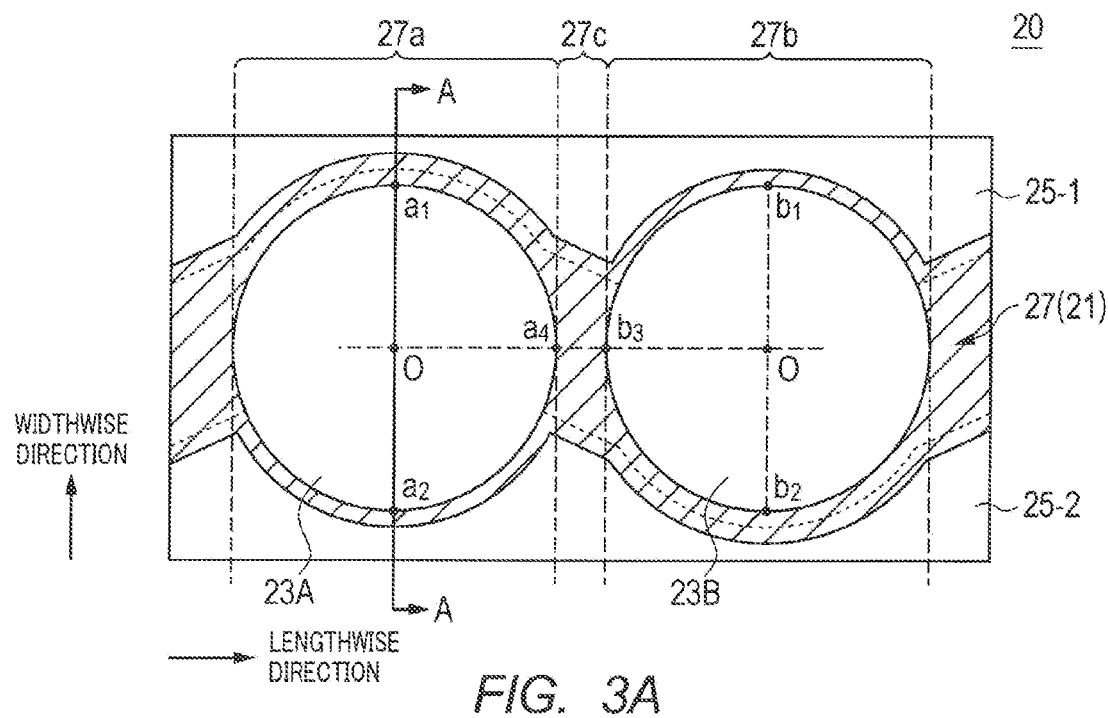
FIG. 3A is a plan view illustrating an example of a second embodiment 1 of the elongated laminate film of the present invention.
Figure 3B:
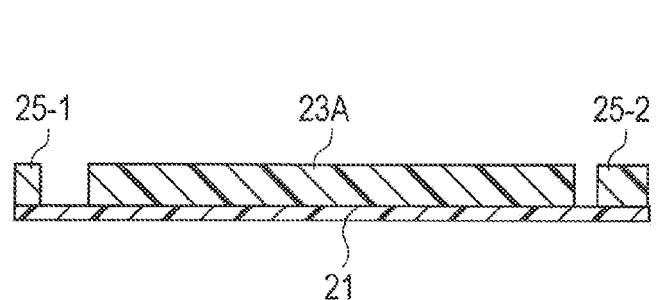
FIG. 3B is a sectional view taken along line A-A in FIG. 3A.

FIG. 3A is a plan view illustrating an example of second embodiment 1 of the elongated laminate film of the present invention. FIG. 3B is a sectional view taken along line A-A in FIG. 3A. As illustrated in FIG. 3A, elongated laminate film 20 includes elongated release film 21, a plurality of insular adhesive films 23A and 23B provided thereon, and a pair of side parts 25-1 and 25-2 surrounding the outsides of insular adhesive films 23A and 23B and being provided along the lengthwise direction of release film 21.

Release film 21 may be defined in the same manner as the above-mentioned release film 11. Insular adhesive films 23A and 23B may be defined in the same manner as the above-mentioned insular adhesive films 13A and 13B. A pair of side parts 25-1 and 25-2 may be defined in the same manner as the above-mentioned pair of side parts 15-1 and 15-2 except for their different shapes.

Exposed part 27 of release film 21 having a predetermined shape is formed between insular adhesive films 23A and 23B and the pair of side parts 25-1 and 25-2.

Exposed part 27 includes frame-like exposed part 27a formed between insular adhesive film 23A and the pair of side parts 25-1 and 25-2, frame-like exposed part 27b formed between insular adhesive film 23B and the pair of side parts 25-1 and 25-2, and exposed part 27c connecting exposed part 27a and exposed part 27b.

Exposed part 27c extends in the oblique direction relative to the lengthwise direction of release film 21, and includes one or both of apex a4 and apex b3, apex a4 being an apex of insular adhesive film 23A in the lengthwise direction of release film 21 (one end of insular adhesive film 23A in the lengthwise direction of release film 21) and apex b3 being an apex of insular adhesive film 23B in the lengthwise direction of release film 21 (the other end of insular adhesive film 23B in the lengthwise direction of release film 21).

The "direction in which exposed part 27c extends" is indicated by center line 1 connecting "middle point ao on tangent 1a (tangent to apex a4), of insular adhesive film 23A, parallel to the widthwise direction of the release film" and "middle point bo on tangent 1b (tangent to apex b3), of insular adhesive film 23B, parallel to the widthwise direction of the release film."

The "middle point ao on tangent 1a" means a middle point of "line segment of tangent 1a divided by two outer peripheral lines or their extended lines (extending in the lengthwise direction of the release film) constituting exposed part 27c." Likewise, the "middle point bo on tangent 1b" means a middle point of "line segment of tangent 1b divided by two outer peripheral lines or their extended lines (extending in the lengthwise direction of the release film) constituting exposed part 27c."

The angle θ formed between the direction in which exposed part 27c extends and the lengthwise direction of release film 21 may be set in a similar range to that of the angle θ formed between the direction in which exposed part 17c in the above-described first embodiment extends and the lengthwise direction of release film 11. One exposed part 27c and the other exposed part 27c which are adjacent to each other extend in opposite directions.

Two cut marks extending in the oblique direction (dotted line parts) are formed on the surface of release film 21 at exposed part 27c. The cut marks are formed when obtaining first peeling part 37 in a precut processing of a method of manufacturing a laminate film described hereinafter (see FIG. 10 described hereinafter).

Exposed part 27 corresponds to a combined area of the following parts of FIG. 10 described hereinafter: first peeling part 37, second peeling part 39 and third peeling part 41. Specifically, exposed part 27a corresponds to a combined area of the following parts in FIG. 10 described hereinafter: peripheral part 37A1 constituting first peeling part 37, peripheral part 39A2 constituting second peeling part 39 and outer peripheral part 41A1 constituting third peeling part 41. Exposed part 27b corresponds to a combined area of the following parts in FIG. 10 described hereinafter: peripheral part 37B2 constituting first peeling part 37, outer peripheral part 39B2 constituting second peeling part 39 and peripheral part 41B1 constituting third peeling part 41. Exposed part 27c corresponds to a combined area of the following parts in FIG. 10 described hereinafter: connection part 37C constituting first peeling part 37, connection part 39C2 constituting second peeling part 39 and connection part 41C1 constituting third peeling part 41.

In this manner, all of the outer peripheries of insular adhesive films 23A and 23B are surrounded by exposed part 27 of release film 21. By virtue of such a structure, during a step of attaching insular adhesive film 23A or 23B to the wafer (see FIG. 12 described hereinafter), it becomes possible to easily peel off insular adhesive film 23A or 23B from release film 21 and easily attach it to the wafer.

While FIG. 3A illustrates an example in which exposed part 27c extends in the oblique direction relative to the lengthwise direction of release film 21, there is no particular limitation to the direction of extension, and exposed part 27c may extend in a direction parallel to the lengthwise direction of release film 21. Even in that case, two cut marks extending in the oblique direction (dotted lines) relative to the lengthwise direction of release film 21 may be formed on the surface of release film 21 at exposed part 27c.

Figure 4A:
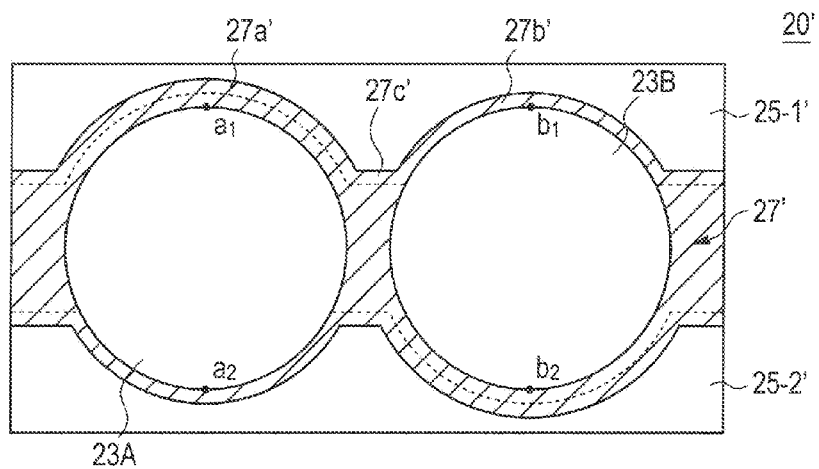
FIG. 4A is a plan view illustrating a modification of the second embodiment 1 of the elongated laminate film of the present invention.

The shape of exposed part 27 is not limited to the shape illustrated in FIG. 3A, and may assume various shapes (see, e.g., FIG. 4A).

FIG. 4A is a plan view illustrating the modification of the second embodiment 1 of the elongated laminate film of the present invention. As illustrated in FIG. 4A, elongated laminate film 20' is configured approximately the same as in FIG. 3A except that both exposed part 27c' and the cut marks (dotted line parts) on the surface of release film 21 exposed at exposed part 27c' extend in a direction parallel to the lengthwise direction of release film 21.

Second Embodiment 2

Figure 4B:
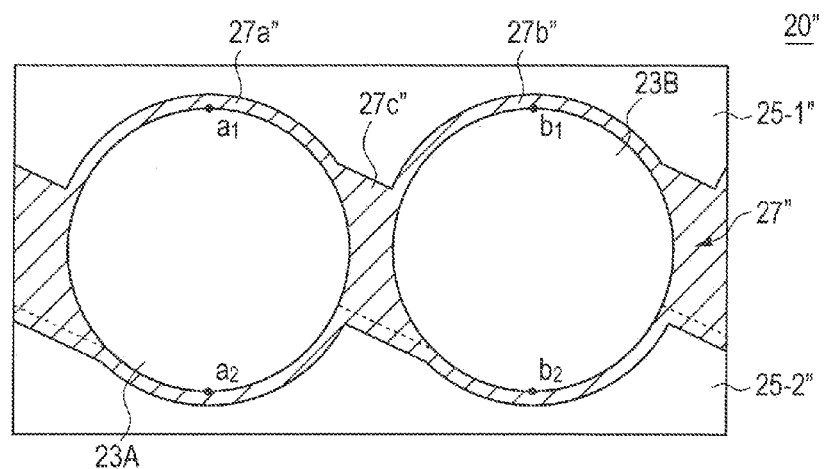
FIG. 4B is a plan view illustrating an example of a second embodiment 2 of the elongated laminate film of the present invention.

FIG. 4B is a plan view illustrating an example of the second embodiment 2 of the elongated laminate film of the present invention. As illustrated in FIG. 4B, elongated laminate film 20" is configured approximately the same as in FIG. 3A except that one exposed part 27c" and the other exposed part 27c" which are adjacent to each other extend in the same direction, and that there is one cut mark (dotted line part) on the surface of release film 21 at exposed part 27c".

Exposed part 27c" corresponds to a combined area of first peeling part 37" and second peeling part 39" in FIG. 11B described hereinafter. Specifically, exposed part 27a" corresponds to a combined area of the following parts in FIG. 11B described hereinafter: peripheral part 37A1" constituting first peeling part 37" and peripheral part 39A2" constituting second peeling part 39". Exposed part 27b" corresponds to a combined area of the following parts in FIG. 11B described hereinafter: peripheral part 37B1" constituting first peeling part 37" and peripheral part 39B2" constituting second peeling part 39". Exposed part 27c" corresponds to a combined area of the following parts in FIG. 11B described hereinafter: connection part 37C" constituting first peeling part 37" and connection part 39C2" constituting second peeling part 39".

Figure 4C:
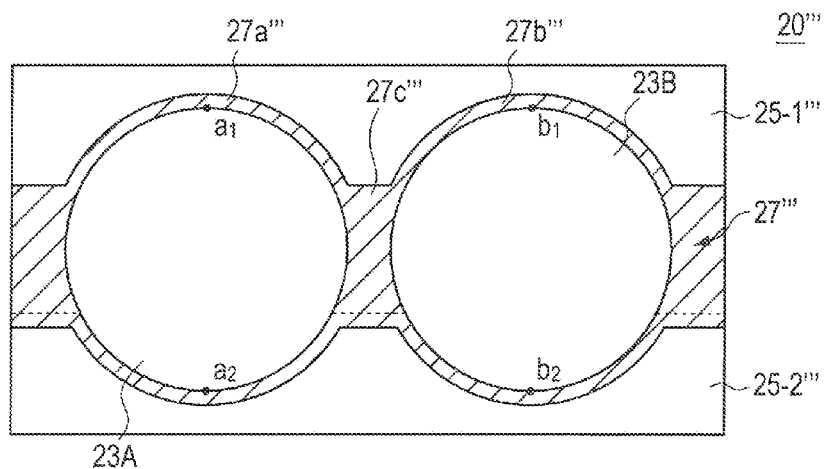
FIG. 4C is a plan view illustrating a modification of the second embodiment 2 of the elongated laminate film of the present invention.

FIG. 4C is a plan view illustrating the modification of the second embodiment 2 of the elongated laminate film of the present invention. As illustrated in FIG. 4C, elongated laminate film 20''' is configured approximately the same as in FIG. 4B except that both exposed part 27c''' and the cut mark (dotted line part) on the surface of release film 21 at exposed part 27c''' extend in a direction parallel to the lengthwise direction of release film 21.

Insular Adhesive Films 13A, 13B, 23A and 23B

Insular adhesive films 13A and 13B contain at least a substrate layer having expandability, and may further contain an adhesive layer, a low friction layer, an intermediate layer, or the like, as necessary.

(1) Substrate Layer Having Expandability

The substrate layer having expandability contains a 1-butene.α-olefin copolymer (A) and a propylene-based elastomer composition (B).

1-Butene.α-Olefin Copolymer (A)

The 1-butene.α-olefin copolymer (A) contained in the substrate layer having expandability is a copolymer containing 1-butene as a main structural component. The α-olefin in the 1-butene.α-olefin copolymer (A) may be a $C_2$-$C_{10}$ α-olefin other than 1-butene. Examples of the $C_2$-$C_{10}$ α-olefin include ethylene, propylene, 1-pentene, 1-hexene, 1-heptene, 1-octene, 1-nonene and 1-decene, with ethylene and propylene being preferred. The α-olefin contained in the 1-butene.α-olefin copolymer (A) may be either one compound or a combination of two or more of compounds. The content of 1-butene contained in the 1-butene.α-olefin copolymer (A) is preferably 80% by mole or more, and more preferably 90% by mole or more. When the content thereof is less than 80% by mole, sufficient expandability cannot be obtained.

The density of the 1-butene.α-olefin copolymer (A) is preferably 890 to 950 kg/m$^3$, although the density thereof is not particularly limited. Too low density may sometimes lower the tensile elasticity, making it impossible to obtain sufficient expandability.

The tensile elasticity of a film composed of the 1-butene.α-olefin copolymer (A) at 23° C. is preferably 100 to 500 MPa, and more preferably 150 to 450 MPa. This is because too high tensile elasticity causes the film to be too rigid to be expanded, while too low tensile elasticity causes the film to be too soft, leading to lowered handleability.

The above-mentioned tensile elasticity can be measured as follows: 1) as a measurement sample, a sample film, for example, having an initial length of 140 mm, a width of 10 mm, and a thickness of 75 to 100 μm, is provided; 2) then, a tensile test is conducted under the following conditions: a measurement temperature of 25° C., a chuck-to-chuck distance of 100 mm, and a tensile rate of 50 mm/min, to thereby measure the change (mm) of the elongation of the sample; and 3) to an S-S curve (stress-strain curve) obtained above, a tangent is drawn to an initial rising point of the curve and the slope of the tangent is divided by a sectional area of the sample film, thereby obtaining a value to be used as the tensile elasticity.

Melt flow rate (MFR) of the 1-butene.α-olefin copolymer (A) measured at 230° C. and under a load of 2.16 kg in accordance with ASTM D1238 is not particularly specified as long as the MFR is in a range such that the 1-butene-α-olefin copolymer (A) is easily mixed uniformly with the propylene-based elastomer composition (B) in an extruder; however, the MFR is preferably 1 to 20 g/10 min, and more preferably 1 to 10 g/10 min. This is because the MFR in the above-mentioned range enables relatively uniform extrusion molding of the 1-butene.α-olefin copolymer (A) and the propylene-based elastomer composition (B).

Propylene-Based Elastomer Composition (B)

The propylene-based elastomer composition (B) contained in the substrate layer having expandability contains a propylene.α-olefin copolymer (b1) as a main component, and preferably further contains polypropylene (b2).

The propylene.α-olefin copolymer (b1) is a copolymer of propylene and an α-olefin other than propylene. The α-olefin in the propylene.α-olefin copolymer (b1) is preferably a $C_2$-$C_{20}$ α-olefin. Examples of the $C_2$-$C_{20}$ α-olefin include ethylene, 1-butene, 1-pentene, 1-hexene, 1-heptene, 1-octene, 1-nonene and 1-decene, with ethylene and 1-butene being preferred. The α-olefin contained in the propylene.α-olefin copolymer (b1) may be either one compound or a combination of two or more of compounds. The propylene.α-olefin copolymer (b1) is preferably a propylene.1-butene.ethylene copolymer.

The content of a structural unit derived from propylene of the propylene.α-olefin copolymer (b1) is preferably 50% by mole or more, and more preferably 60% by mole or more, from the viewpoint of obtaining satisfactory rubber elasticity.

It is sufficient for the propylene.α-olefin copolymer (b1) to have rubber elasticity at the handling temperature of an expandable film, and the glass transition temperature thereof is preferably 25° C. or lower. When the glass transition temperature exceeds 25° C., the physical properties, such as expandability, of formed films may be changed easily depending on the storing conditions.

While polypropylene (b2) is substantially a single polymer of propylene, it may also contain a small amount of α-olefins other than propylene; any of so-called homopolypropylene (hPP), random polypropylene (rPP) and block polypropylene (bPP) may be employed. The content of the α-olefin other than propylene in the polypropylene (b2) is preferably 20% by mole or less, and more preferably 10% by mole or less. Such polypropylene (b2) can be expected to have effects of inhibiting the blocking of the propylene.α-olefin copolymer (b1) or of improving the film moldability.

The content of the polypropylene (b2) to the total of 100 parts by weight of the propylene-based elastomer composition (B) is preferably 1 to 70 parts by weight, more preferably 5 to 70 parts by weight, even more preferably 5 to 30 parts by weight, and particularly preferably 5 to 20 parts by weight. The content of the polypropylene (b2) being less than 10 parts by weight may sometimes cause the blocking of the propylene.α-olefin copolymer (b1), leading to unstable extruding condition during film molding. When the content of the polypropylene (b2) is more than 30 parts by weight, the expansion rate may sometimes become smaller.

The tensile elasticity of a film composed of the propylene-based elastomer composition (B) at 23° C. is preferably 8 to 500 MPa, more preferably 10 to 500 MPa, even more preferably 10 to 100 MPa, particularly preferably 10 to 50 MPa, and more particularly preferably 10 to 45 MPa. The tensile elasticity of the film composed of the propylene-based elastomer composition (B) may be measured in the same manner as described above.

Melt flow rate (MFR) of the propylene-based elastomer composition (B) measured at 230° C. and under a load of 2.16 kg in accordance with ASTM D1238 is not particularly specified as long as the MFR is in a range such that the propylene-based elastomer composition (B) is easily mixed uniformly with the 1-butene.α-olefin copolymer (A) in an extruder; however, the MFR is preferably 1 to 20 g/10 min, and more preferably 1 to 10 g/10 min. The MFR in the above-mentioned range enables extrusion-molding for obtaining a film having relatively uniform thickness.

The content of the propylene-based elastomer composition (B) contained in the substrate layer having expandability is preferably 30 to 70 parts by weight, and more preferably 40 to 60 parts by weight, based on 100 parts by weight of the total of (A) and (B).

The substrate layer having expandability is obtained by dry-blending or melt-blending the above-mentioned 1-butene.α-olefin copolymer (A) and propylene-based elastomer composition (B), followed by extrusion-molding. The expandable film thus obtained has a structure in which the 1-butene.α-olefin copolymer (A) having relatively high crystallinity and high tensile elasticity, and the propylene-based elastomer composition (B) having relatively low crystallinity and low tensile elasticity are finely dispersed.

For the substrate layer to exhibit at least a certain degree of expandability, the thickness of the substrate having expandability is preferably about 25 to 75% of the total thickness of the insular adhesive film. Specifically, the thickness of the substrate layer having expandability may be 30 to 150 p.m.

(2) Adhesive Layer

The adhesive layer may be composed of a known adhesive and is not particularly limited; the adhesive layer may be composed of an adhesive such as a rubber adhesive, an acrylic adhesive or a silicone adhesive, or of a thermoplastic elastomer such as styrene elastomer or olefin elastomer.

The acrylic adhesive may be a single polymer of acrylic ester compounds, or a copolymer of acrylic ester compounds and comonomers. Examples of the acrylic ester compounds include methyl acrylate, ethyl acrylate, butyl acrylate, and 2-ethylhexyl acrylate. Examples of the comonomers constituting the acrylic copolymer include vinyl acetate, acrylonitrile, acrylamide, styrene, methyl(meth)acrylate, (meth)acrylic acid, hydroxyethyl methacrylate, dimethylaminoethyl methacrylate, glycidyl methacrylate, and maleic anhydride.

The adhesive layer may be composed of a radiation curable adhesive that lowers the adhesive force upon radiation, or a thermosetting adhesive that lowers the adhesive force upon heating. Preferred examples of the radiation curable adhesive include a UV curable adhesive.

The UV curable adhesive or thermosetting adhesive contains an adhesive (such as the acrylic adhesive) together with a photopolymerization initiator or thermal polymerization initiator, and may further contain a curable compound (component having a carbon-carbon double bond) or a cross-linking agent, as necessary.

The photopolymerization initiator can be a compound that is cleaved by UV radiation and generate radicals, and examples of such compounds include ethers such as benzoin methyl ether, benzoin isopropyl ether, and benzoin isobutyl ether; aromatic ketones such as benzyl, benzoin, benzophenone, and α-hydroxycyclohexyl phenyl ketone; and aromatic ketals such as benzyl dimethyl ketal.

The thermosetting initiators are organic peroxide derivatives, azo-polymerization initiators, or the like, and the organic peroxide derivatives are preferred from the viewpoint of lack of nitrogen generation during heating. Examples of the organic peroxide derivatives include ketone peroxide, peroxy ketal, hydroperoxide, dialkyl peroxide, and diacyl peroxide.

The curable compound can be a compound having a carbon-carbon double bond in a molecule thereof which is a monomer, oligomer or polymer that is curable by radical polymerization. Examples of such curable compounds include esters of (meth)acrylic acid and polyhydric alcohols, such as trimethylol propane tri(meth)acrylate, pentaerythritol tri(meth)acrylate, tetraethylene glycol di(meth)acrylate, 1,6-hexanediol di(meth)acrylate, neopentyl glycol di(meth)acrylate, and dipentaerythritol hexa(meth)acrylate. When the adhesive is a UV curable polymer having a carbon-carbon double bond at a side chain thereof, the curable compound is not necessarily added.

The content of the curable compound is preferably 5 to 900 parts by weight, and more preferably 20 to 200 parts by weight, based on 100 parts by weight of the adhesive. When the content of the curable compound is too low, the amount of cured portions becomes too small and the adjustment of adhesive force becomes insufficient. When the content of the curable compound is too high, heat or light sensitivity of the adhesive becomes too high and causes the storage stability to be lowered.

Examples of the cross-linking agents include epoxy compounds such as pentaerythritol polyglycidyl ether; and isocyanate compounds such as tetramethylene diisocyanate, hexamethylene diisocyanate, and polyisocyanate.

The adhesive force of the adhesive layer measured in accordance with JIS Z0237 is preferably 0.1 to 10 N/25 mm, in which the measurement is made by attaching the adhesive layer to the surface of a SUS-304-BA plate, allowing to stand still for 60 minutes and peeling off the adhesive layer from the surface of the SUS-304-BA plate. The adhesive force in the above-mentioned range can maintain satisfactory adhesiveness with the wafer while preventing the adhesive to remain on a chip when the adhesive layer is peeled off from the chip. The adhesive force of the adhesive layer can be adjusted, for example, by the amount of the cross-linking agent to be added. Specifically, the adhesive force can be adjusted in accordance with, for example, the method disclosed in Japanese Patent Application Laid-Open No. 2004-115591.

The thickness of the adhesive layer can be in a range that does not inhibit the above-mentioned expandability of the substrate layer, and typically, the thickness of the adhesive layer can be 1 to 50 μm, and preferably 1 to 25 μm.

(3) Intermediate Layer

The intermediate layer is a layer having an irregularity absorption property for a semiconductor wafer. As described hereinafter, for example, the intermediate layer may be either a layer provided between the substrate layer and the adhesive layer, or a layer also having a function of the adhesive layer.

Tensile elasticity E(25) at 25° C. and tensile elasticity E(60) at 60° C. of the intermediate layer preferably satisfy the relationship $E(60)/E(25)<0.1$, more preferably $E(60)/E(25)<0.08$, and even more preferably $E(60)/E(25)<0.05$. By setting the ratio of tensile elasticity at 25° C. and 60° C. to fall within the above-mentioned range, the intermediate layer exhibits thermal meltability and plastic deformation. Specifically, when the sheet is attached to a wafer while heating, the sheet follows the irregularities on a circuit formation surface of the semiconductor wafer, thereby exhibiting high adhesion, and after the attachment of the sheet, the sheet retains its state of being adhered to the irregularities under normal temperature.

The tensile elasticity E (25) of the intermediate layer at 25° C. is 1 to 10 MPa, and preferably falls within the range of 2 to 9 MPa. When the tensile elasticity E (25) is in the above-mentioned range, after the attachment of the sheet, the sheet can retain its shape under normal temperature and maintain the adhesive property during processing. The tensile elasticity E (60) of the intermediate layer at 60° C. is preferably 0.005 to 1.0 MPa, and more preferably 0.01 to 0.5 MPa. When the tensile elasticity E (60) is in the above-mentioned range, the intermediate layer exhibits fluidity during the attachment of the sheet under heating, thereby enabling the sheet to satisfactorily follow the irregularities of the wafer.

The tensile elasticity of the resin can be measured as follows: 1) as a measurement sample, a sample film, for example, having an initial length of 140 mm, a width of 10 mm, and a thickness of 75 to 100 μm is provided; 2) then, a tensile test is conducted under the following conditions: a measurement temperature of 25° C., a chuck-to-chuck distance of 100 mm, and a tensile rate of 50 mm/min, to thereby measure the change (mm) of the elongation of the sample; and 3) to an S-S curve (stress-strain curve) obtained above, a tangent is drawn to an initial rising point of the curve and the slope of the tangent is divided by a sectional area of the sample film, thereby obtaining a value to be used as the tensile elasticity.

The density of the intermediate layer is preferably 800 to 890 kg/m$^3$, more preferably 830 to 890 kg/m$^3$, and even more preferably 850 to 890 kg/m$^3$. When the density of the intermediate layer is less than 800 kg/m$^3$, the elasticity of the intermediate layer may become too low, thereby causing the shape fixation ability to be lowered. When the density of the intermediate layer is more than 890 kg/m$^3$, the elasticity of the intermediate layer may become too high, thereby lowering the ability of the film to follow the irregularitie.

The resin constituting the intermediate layer is preferably an olefin copolymer, although the resin is not particularly limited as long as it satisfies the tensile elasticity. The olefin copolymer is preferably an α-olefin copolymer containing a $C_2$-$C_{12}$ α-olefin as a main structural unit. Examples of the $C_2$-$C_{12}$ α-olefin include ethylene, propylene, 1-butene, 1-pentene, and 3-methyl-1-butene.

Among those, in terms of excellent ability to follow the irregularities during the attachment of the film, ethylene.α-olefin copolymers such as an ethylene.propylene copolymer, an ethylene.1-butene copolymer, and a terpolymer of ethylene.propylene.$C_4$-$C_{12}$ α-olefin; and a terpolymer of a propylene.1-butene copolymer.$C_5$-$C_{12}$ α-olefin are preferred, with an ethylene.propylene copolymer being more preferred. This is because propylene has higher thermal meltability among other olefin copolymers. Examples of the commercially available α-olefin copolymers include TAFMER (registered trademark) manufactured by Mitsui Chemicals, Inc.

The tensile elasticity of the intermediate layer is adjusted by the type, copolymerization ratio, presence/absence of denaturation, or the like of monomers constituting the olefin copolymers. For example, in order to lower the tensile elasticity of an olefin copolymer at 60° C., the copolymerization ratio of propylene can be increased, or the copolymer can be denatured with a carboxylic acid, or the like.

The thickness of the intermediate layer is preferably larger than a level difference provided on one of the surfaces of the wafer to which the insular adhesive film is adhered, and is not particularly limited as long as the intermediate layer is capable of filling up the level difference (e.g., irregularities (including solder bumps) on a circuit formation surface of the semiconductor wafer). For example, when the level difference among the irregularities is about 100 μm, the thickness of the intermediate layer can be 100 to 300 μm. That is, the thickness of the intermediate layer is preferably 1 to 3 times, more preferably 1 to 2 times the level difference of the wafer surface.

(4) Low Friction Layer

The low friction layer can be disposed, as necessary, on a surface of the substrate layer which surface is opposite to the adhesive layer. That is, methods of expanding the insular adhesive film include a method in which a peripheral part of the insular adhesive film is fixed with a ring frame and pressing up a stage of an expander from the bottom central part of the insular adhesive film. During this process, when a large friction is applied to a surface of the insular adhesive film which is being in contact with the stage, slippage of the film on the stage may become difficult, sometimes making it difficult to expand a part of the film which is being in contact with the stage. When a low friction layer is disposed on the surface of the insular adhesive film which is in contact with the stage, it becomes possible to slide the stage of the expander more easily, thus enabling the insular adhesive film to be expanded more uniformly.

Such a low friction layer is composed of a resin such as polyethylene or an ethylenic ionomer resin. In addition, the surface of the low friction layer may be coated with or may contain a slipping agent such as erucamide, oleamide, and silicone oil, for further enhancing slippage, as necessary.

The total thickness of the insular adhesive film is, for example, preferably 50 to 200 μm, and more preferably 70 to 150 μm, although the total thickness thereof is not particularly limited.

(5) Layer Structure of Insular Adhesive Film

Insular adhesive films 13A and 13B are not particularly limited, and may be either a single-layered product composed of the substrate layer having expandability, or a laminated product composed of the substrate layer and other layers. Examples of the laminated product composed of the substrate layer and other layers include a film composed of at least two layers including the substrate layer and the adhesive layer, or the substrate layer and the intermediate layer; a film composed of three layers including the substrate layer, the intermediate layer and the adhesive layer laminated sequentially in the order; and a film composed of four layers or more which include the substrate layer, the adhesive layer and the intermediate layer, and an additional low friction layer, or the like.

When each of insular adhesive films 13A and 13B is a laminated product having the substrate layer, the adhesive layer and the low friction layer, it is preferable that the adhesive layer is disposed on one surface side of the substrate layer, and that the low friction layer is disposed on the other surface side of the substrate layer. A layer other than the above-mentioned layers may be further laminated, for example, between the substrate layer and the adhesive layer, between the substrate layer and the intermediate layer, between the intermediate layer and the adhesive layer, or between the substrate layer and the low friction layer. In addition, each of the substrate layer, the intermediate layer and the adhesive layer may be multilayered.

Figure 5:
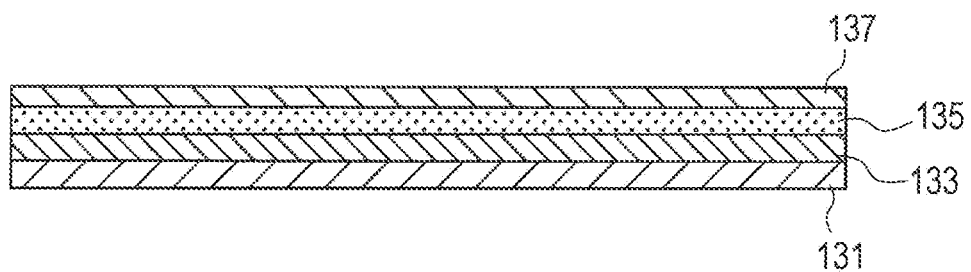
FIG. 5 is a sectional view illustrating a preferred example of a layer structure of an insular adhesive film.

FIG. 5 is a sectional view illustrating a preferred example of a layer structure of the insular adhesive film. As illustrated in FIG. 5, insular adhesive film 13A' (23A') has adhesive layer 131, intermediate layer 133, substrate layer 135 and low friction layer 137 in this order from the side being in contact with the release film (not illustrated).

The peel strength between insular adhesive films 13A and 13B (or 23A and 23B) and release film 11 (or 21) is preferably 1 to 35 g/50 mm, and more preferably 1 to 25 g/50 mm Setting the peeling strength to not more than a certain degree enables the end part of insular adhesive film 13A or 13B (23A or 23B) to be easily peeled off from the surface of release film 11, making it easier to produce a peeling starting point. On the other hand, setting the peeling strength to at least a certain degree can prevent the peeling off of even necessary parts when an unnecessary part is peeled off after the precut step described hereinafter.

The peel strength may be measured under the environment such that the temperature is 23° C. and a relative humidity is 50%, in accordance with an adhesive sheet test method as set forth in JIS Z0237. Specifically, the test method is conducted as follows:

1) An insular adhesive film is attached to a release film while applying pressure to the release film with a rubber roll of about 2-kg, and then the resultant film is cut out into a width of 50 mm to obtain a test piece. The test piece is placed for 30 minutes under the constant environment such that the temperature is 23° C. and the relative humidity is 50%.

2) Next, clips are attached respectively to the insular adhesive film and the release film of the test piece, and the force necessary for peeling off the films from each other by pulling the films in a direction 180° from each other at a peeling rate of 300 mm/min is measured. The measurement of the peel strength is conducted twice, and the average of the measured peel strength is defined as the "peel strength" (g/50 mm).

The thickness of the laminate film of the present invention may be, for example, about 60 to 400 μm.

2. Method of Manufacturing Laminate Film

The method of manufacturing the laminate film of the present invention includes the steps of: 1) obtaining an elongated laminate containing an elongated release film and an elongated adhesive film; 2) precutting the adhesive film in the laminate to obtain a first peeling part surrounded by a cut line; and 3) peeling off the first peeling part from the release film.

First Embodiment

The above-described laminate film of First Embodiment (e.g., laminate film illustrated in FIG. 1A) can be obtained by the steps of: 1) obtaining an elongated laminate containing an elongated release film and an elongated adhesive film; 2) precutting the adhesive film in the laminate to obtain a first peeling part surrounded by a cut line; and 3) peeling off the first peeling part from the release film.

1) Step of Obtaining Laminate

An elongated laminate containing an elongated release film and an elongated adhesive film is obtained.

Figure 6:
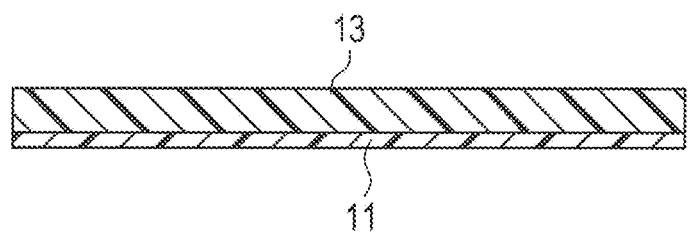
FIG. 6 is a sectional view illustrating an example of an elongated laminate.

FIG. 6 is a sectional view illustrating an example of the elongated laminate. As illustrated in FIG. 6, elongated laminate 30 contains elongated release film 11 and elongated adhesive film 13.

Elongated release film 11 is similar to that described above. Elongated adhesive film 13 is provided preferably on the entire surface of release film 11, and the above-mentioned plurality of insular adhesive films are obtained by the subsequent precut step 2). That is, elongated adhesive film 13 is a precursor for the plurality of insular adhesive films.

The elongated laminate may be manufactured by an arbitrary method, and can be obtained, for example, through the steps of: 1) obtaining an adhesive film, and 2) laminating a release film on the adhesive film. For example, when the adhesive film has the above-mentioned layer structure as illustrated in FIG. 5, the above-described adhesive film of step 1) can be obtained by a method of laminating resin melts constituting the respective layers by coextrusion (coextrusion method); a method of laminating resin melts constituting other layers on a substrate layer (extrusion lamination); a method of laminating resin films constituting the respective layers via thermal compression, an adhesive, or the like (lamination method); a method of laminating a resin composition constituting an adhesive layer on a substrate layer or on a laminated product of the substrate layer and an intermediate layer by coating (coating method); or other methods.

2) Step of Precutting to Obtain First Peeling Part

Next, the adhesive film of the resultant elongated laminate is precut (a cut line is formed) into a predetermined shape to obtain a first peeling part surrounded by the cut line.

Figure 7:
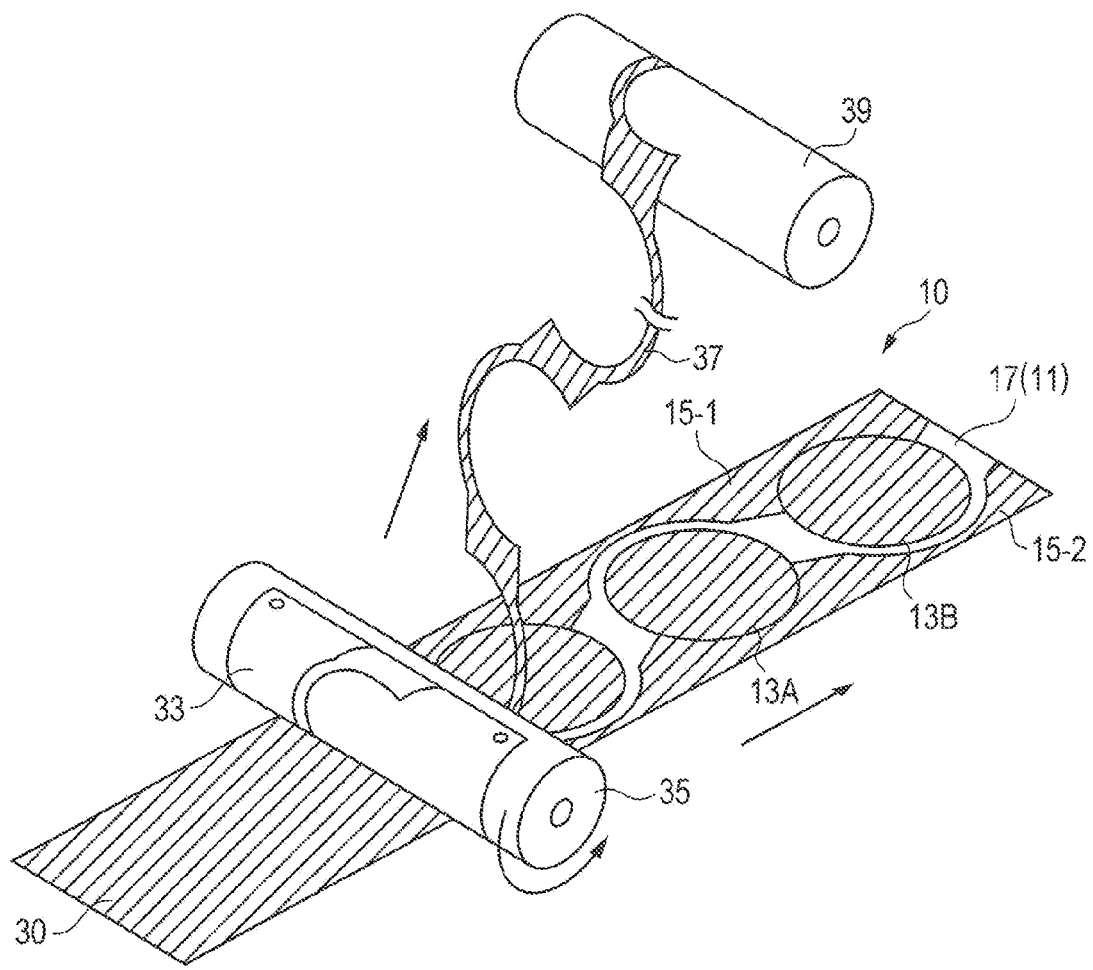
FIG. 7 is a perspective view illustrating an example of a precut step.

FIG. 7 is a perspective view illustrating an example of the precut step. As illustrated in FIG. 7, magnet cylinder 35 equipped with precutting planar blade tool 33 having a blade pattern corresponding to a shape to be precut is pressed against adhesive film 13 of elongated laminate 30. Then, cut line is formed on adhesive film 13 of elongated laminate 30 (i.e., adhesive film 13 is precut) to obtain first peeling part 37 surrounded by the cut line.

Through the precut step, the entire part of adhesive film 13 of elongated laminate 30 is cut in the thickness direction, whereas release film 11 is not cut at all or only partially cut in the thickness direction.

Figure 16:
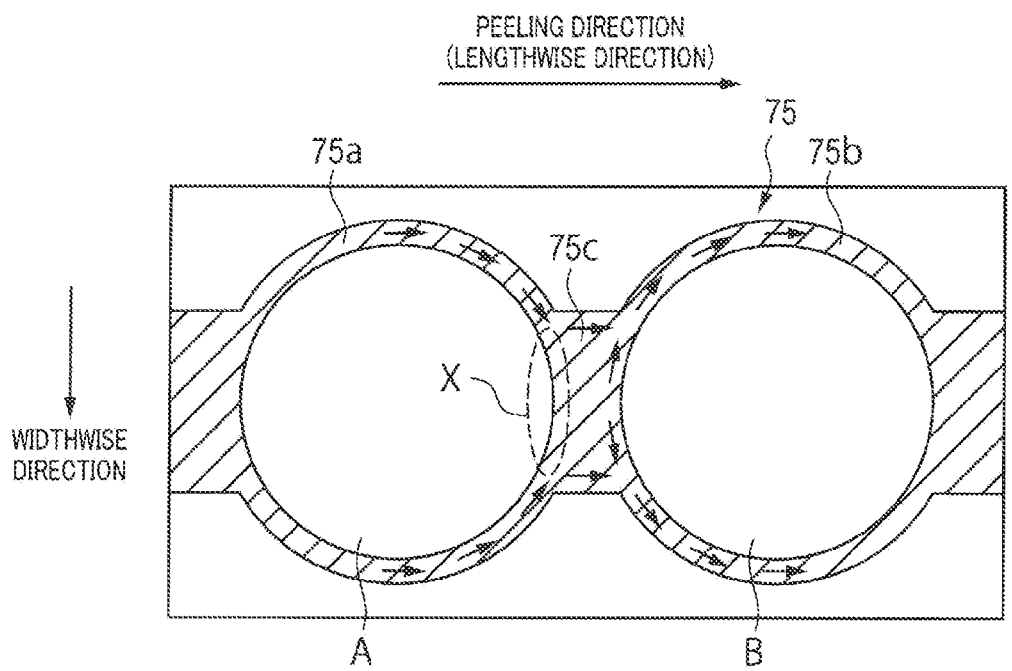
FIG. 16 is a diagram illustrating the shape of a conventional peeling part.

As described above, conventional peeling part 75 composed of a single sheet has outer peripheral part 75a of insular adhesive film A, outer peripheral part 75b of insular adhesive film B, and connection part 75c connecting these parts in the lengthwise direction (peeing direction) of the release film (hatched part), as illustrated in FIG. 16. That is, conventional peeling part 75 composed of a single sheet has a branching part that branches from connection part 75c in the lengthwise direction (peeling direction) of the release film in a manner such that outer peripheral part 75b of insular adhesive film B separates into one widthwise end side of the release film and into the other widthwise end side of the release film.

As illustrated in FIG. 16, when outer peripheral part 75a of insular adhesive film A, connection part 75c, and outer peripheral part 75b of insular adhesive film B are intended to be peeled off sequentially along the lengthwise direction of the release film, tension as indicated by arrows is considered to be applied to peeling part 75. As a result, peeling tension is less likely to be applied to a cut part (solid line part) of area X of peeling part 75, which is around the downstream end in the peeling direction of insular adhesive film A, sometimes causing insular adhesive film A to be peeled off together with peeling part 75.

In view of such problems, as a result of intensive studies, the present inventors have found that peeling tension may be easily applied to the cut part of area X around the downstream end in the peeling direction of insular adhesive film A by removing the above-mentioned branching part from the shape of the peeling part composed of a single sheet, i.e., the part that is branching from connection part 75c along the lengthwise direction (peeling direction) of the release film, into one widthwise end side of the release film and into the other widthwise end side of the release film of the outer peripheral part of insular adhesive film B.

Figure 17:
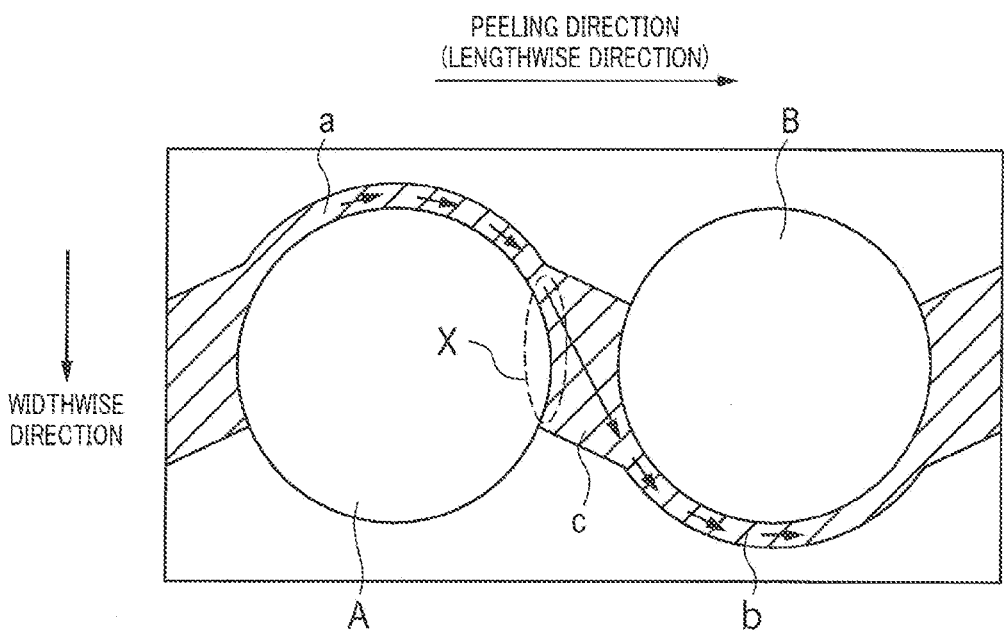
FIG. 17 is a diagram illustrating an example of the shape of the peeling part of the present invention.

Specifically, when the shape of the peeling part composed of a single sheet is made into a shape as illustrated which has no branching part, for example, in FIG. 17, it becomes possible to allow the peeling tension (shearing force) to occur in the oblique direction as indicated by arrows at the cut part of area X around the downstream end in the peeling direction of insular adhesive film A, when outer peripheral part a of insular adhesive film A, connection part c, and outer peripheral part b of insular adhesive film B are peeled off sequentially along the lengthwise direction of the release film. Thus, it becomes possible to precisely peel off only the peeling part without peeling off insular adhesive film A.

Figure 8:
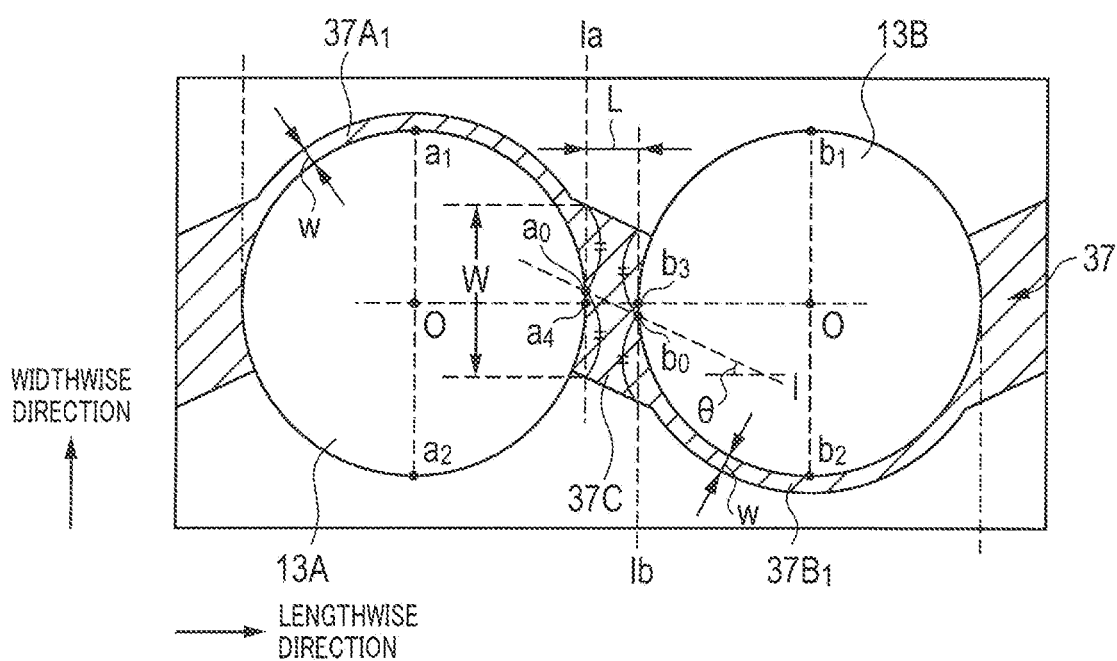
FIG. 8 is an explanatory plan view of an example of the shape of a first peeling part in the first embodiment of the present invention.
Figure 9A:
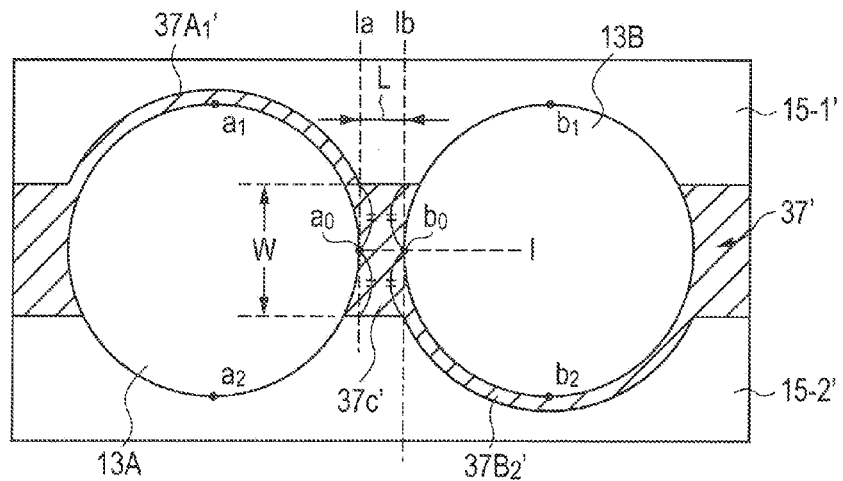
FIG. 9A is a plan view illustrating a modification of the first peeling part.
Figure 9B:
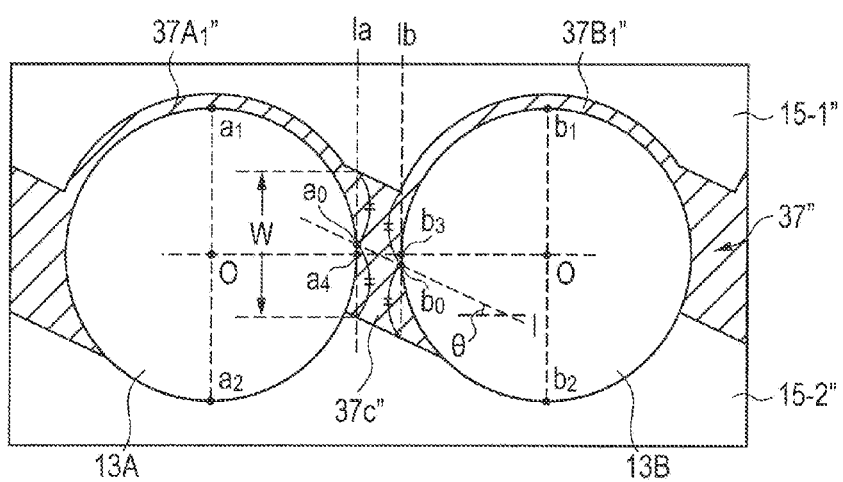
FIG. 9B is a plan view illustrating another modification of the first peeling part.
Figure 9C:
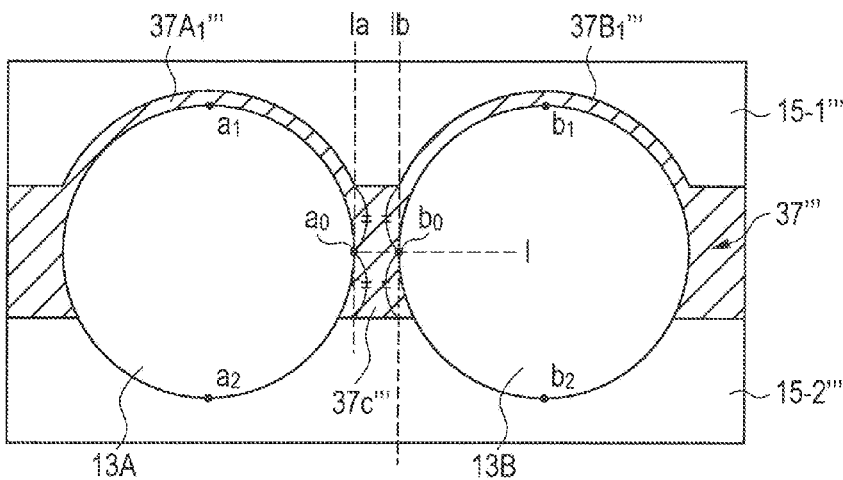
FIG. 9C is a plan view illustrating another modification of the first peeling part.

That is, the first peeling part is provided continuously in a predetermined shape, and has the following features:
1) the first peeling part includes peripheral part A1 of insular adhesive film A at one widthwise end side of the release film, peripheral part B2 of insular adhesive film B at the other widthwise end side of the release film and connection part C connecting the peripheral part A1 and the peripheral part B2, but does not include peripheral part A2 of insular adhesive film A at the other widthwise end side of the release film and peripheral part B1 of insular adhesive film B at one widthwise end side of the release film (see FIGS. 8 and 9A described hereinafter); or alternatively
2) the first peeling part includes peripheral part A1 of insular adhesive film A at one widthwise end side of the release film, peripheral part B1 of insular adhesive film B at one widthwise end side of the release film and connection part C connecting the peripheral part A1 and the peripheral part B1, but does not include peripheral part A2 of insular adhesive film A at the other widthwise end side of the release film and peripheral part B2 of insular adhesive film B at the other widthwise end side of the release film (see FIGS. 9B and 9C described hereinafter).

The "peripheral part A1 of insular adhesive film A at one widthwise end side of the release film" is a part that includes point a1 which is the point closest to one widthwise end of the release film among the outer peripheral parts of insular adhesive film A, and that faces one widthwise end of the release film. The "peripheral part A2 of insular adhesive film A at the other widthwise end side of the release film" is a part that includes point a2 which is the point closest to the other widthwise end of the release film among the outer peripheral parts of insular adhesive film A, and that faces the other widthwise end of the release film.

Likewise, the "peripheral part B1 of insular adhesive film B at one widthwise end side of the release film" is a part that includes point b1 which is the point closest to one widthwise end of the release film among the outer peripheral part of insular adhesive film B, and that faces one widthwise end of the release film. The "peripheral part B2 of insular adhesive film B at the other widthwise end side of the release film" is a part that includes point b2 which is the point closest to the other widthwise end of the release film among the outer peripheral parts of insular adhesive film B, and that faces the other widthwise end of the release film.

For example, when both of insular adhesive films A and B have a circular shape, the "point a1 which is the closest to one widthwise end of the release film out of the outer peripheral part of insular adhesive film A" means apex a1 at one widthwise end side of insular adhesive film A. Likewise, the "point b2, of insular adhesive film B, which is the closest to the other widthwise end of the release film" means apex b2 at the other widthwise end side of insular adhesive film B.

Connection part C either connects the above-mentioned peripheral part A1 and peripheral part B2 (case of the above-mentioned 1)), or connects the above-mentioned peripheral part A1 and peripheral part B1 (case of the above-mentioned 2)). Connection part C is in contact with one or both of the following: one end of insular adhesive film A in the lengthwise direction of the release film, and the other end of insular adhesive film B in the lengthwise direction of the release film. Connection part C is preferably in contact with both of them.

The "one end of insular adhesive film A in the lengthwise direction of the release film" may be an intersection of the outer peripheral part of insular adhesive film A and a line connecting the centers of insular adhesive films A and B. For example, when insular adhesive film A has a circular shape, the "one end of the outer peripheral part of insular adhesive film A in the lengthwise direction of the release film" means one of two apexes of the outer peripheral part of insular adhesive film A in the lengthwise direction of the release film. Likewise, "the other end of insular adhesive film B in the lengthwise direction of the release film" may be an intersection of the outer peripheral part of insular adhesive film B and a line connecting the centers of insular adhesive films A and B.

Connection part C extends parallel to or in the oblique direction relative to the lengthwise direction of the release film. In order to peel off the first peeling part precisely along the lengthwise direction of the release film, connection part C preferably extends in the oblique direction relative to the lengthwise direction of the release film. That is, angle θ formed between the direction in which connection part C extends and the lengthwise direction of release film 11 may be 0° or more and 80° or less, preferably more than 0° and 75° or less, and more preferably 15° or more and 70° or less.

The "direction in which connection part C extends" is indicated by center line 1 connecting "middle point ao of insular adhesive film A which is on tangent 1*a* parallel to the widthwise direction of the release film at connection part C" and "middle point bo of insular adhesive film B which is on tangent 1*b* parallel to the widthwise direction of the release film at connection part C" (see FIG. 8 described hereinafter).

FIG. 8 is an explanatory plan view of an example of the shape of the first peeling part in the first embodiment of the present invention. In FIG. 8, solid lines shown on release film 11 indicate cut lines.

As illustrated in FIG. 8, first peeling part 37 is an area surrounded by cut lines (hatched part), and includes peripheral part 37A1 of insular adhesive film 13A at one widthwise end side of the release film, peripheral part 37B2 of insular adhesive film 13B at the other widthwise end side of the release film, and connection part 37C connecting peripheral part 37A1 of insular adhesive film 13A at one widthwise end side and peripheral part 37B2 of insular adhesive film 13B at the other widthwise end side.

Peripheral part 37A1 is a part that includes apex a1 of insular adhesive film A at one widthwise end side of release film 11, and that faces one widthwise end of release film 11. Peripheral part 37B2 is a part that includes apex b2 of insular adhesive film B at the other widthwise end side of release film 11, and that faces the other widthwise end of release film 11.

Width w of peripheral parts 37A1 and 37B2 may be selected appropriately, and may be, for example, about 0.5 to 2% of the diameter of insular adhesive film 13A (or 13B). For example, for obtaining an insular adhesive film to be used for attachment to a 12-inch semiconductor wafer, width w of peripheral parts 37A1 and 37B2 may be about 2 to 6 mm.

Connection part 37C connects peripheral parts 37A1 and peripheral parts 37B2, and includes one or both of apex a4 and apex b3, apex a4 being an apex of insular adhesive film 13A in the lengthwise direction of release film 11 (one end of insular adhesive film 13A in the lengthwise direction of release film 11) and apex b3 being an apex of insular adhesive film 13B in the lengthwise direction of release film 11 (the other end of insular adhesive film 13B in the lengthwise direction of release film 11).

For example, when first peeling part 37 is peeled off sequentially in the order of peripheral part 37A1, connection part 37C and peripheral part 37B2, connection part 37C preferably includes at least apex a4 of insular adhesive film 13A in the lengthwise direction of release film 11 (lower end part in the peeling direction), and more preferably includes both of apex a4 and apex b3, apex a4 being the apex of insular adhesive film 13A in the lengthwise direction of release film 11 (lower end part in the peeling direction) and apex b3 being the apex of insular adhesive film 13B in the lengthwise direction of release film 11 (upper end part in the peeling direction).

Connection part 37C extends in the oblique direction relative to the lengthwise direction of release film 11. Angle θ formed between the direction in which connection part C extends and the lengthwise direction of release film 11 may be more than 0° and 80° or less, preferably more than 0° and 75° or less, and more preferably 15° or more and 70° or less.

As described above, the "direction in which connection part 37C extends" is indicated by center line 1 connecting "middle point ao of insular adhesive film 13A which is on tangent 1*a* parallel to the widthwise direction of the release film" and "middle point bo of insular adhesive film 13B which is on tangent 1*b* parallel to the widthwise direction of the release film."

The "middle point ao on tangent 1*a*" means a middle point of "line segment of tangent 1*a* divided by two outer peripheral lines or their extended lines (extending in the lengthwise direction of the release film) constituting connection part 37C." Likewise, the "middle point bo on tangent 1*b*" means a middle point of "line segment of tangent 1*b* divided by two outer peripheral lines or their extended lines (extending in the lengthwise direction of the release film) constituting connection part 37C."

Width W of connection part 37C may be selected so that first peeling part 37 can be peeled off in a shape which is partitioned by cut lines, and may be, for example, about 30 to 90%, more preferably about 30 to 70% of the diameter of insular adhesive film 13A (or 13B). For example, when obtaining an insular adhesive film to be used for attachment to a 12-inch semiconductor wafer, width W of connection part 37C may be about 110 to 260 mm.

Length L of connection part 37C is appropriately selected depending on the interval between insular adhesive films 13A and 13B, and may be, for example, about 0.5 to 10% of the diameter of insular adhesive film 13A (or 13B); specifically the length of connection part 37C may be about 3 to 20 mm.

From the viewpoint of increasing the above-mentioned peeling tension in the oblique direction, it is preferable, for example, that angle θ formed between the direction in which connection part 37C extends and the lengthwise direction of release film 11 is made larger; or that width W or length L of connection part 37C is made relatively small.

First peeling part 37 can be obtained by using a precutting planar blade tool having a blade shape corresponding to solid lines shown on the release film of FIG. 8.

The shape of first peeling part 37 is not limited to the shape illustrated in FIG. 8, and may assume various shapes (see, e.g., FIGS. 9A to 9C).

FIG. 9A is a plan view illustrating the modification of the first peeling part. As illustrated in FIG. 9A, first peeling part 37' is configured approximately the same as in FIG. 8 except that connection part 37C' extends parallel to the lengthwise direction of release film 11 (angle θ formed between the direction in which connection part 37C' extends and the lengthwise direction of release film 11 is 0°).

Above all, in order to easily apply peeling tension to connection part 37C', length L of connection part 37C' is preferably as small as possible. That is, length L of connection part 37C' is preferably 20 mm or less, and more preferably 10 mm or less.

FIG. 9B is a plan view illustrating another modification of the first peeling part. As illustrated in FIG. 9B, first peeling part 37" is configured approximately the same as in FIG. 8 except that first peeling part 37" has peripheral part 37B1 of insular adhesive film 13B at one widthwise end side of the release film, in place of peripheral part 37B2 of insular adhesive film 13B at the other widthwise end side of the release film illustrated in FIG. 8.

That is, first peeling part 37" includes peripheral part 37A1" of insular adhesive film 13A at one widthwise end side of the release film, peripheral part 37B1" of insular adhesive film 13B at one widthwise end side of the release film, and connection part 37C" connecting peripheral part 37A1" and peripheral part 37B1".

Peripheral part 37A1" may be defined in the same manner as the above-mentioned peripheral part 37A1. Peripheral part 37B1" is a part that includes apex b1 of insular adhesive film 13B at one widthwise end side of release film 11, and that faces one widthwise end of release film 11. Width w of peripheral parts 37A1" and 37B2" may be set in the same manner as described above.

Connection part 37C" connects peripheral parts 37A1" and peripheral parts 37B2", and includes one or both of apex a4 and apex b3, apex a4 being the apex of insular adhesive film 13A in the lengthwise direction of release film 11 (one end of insular adhesive film 13A in the lengthwise direction of release film 11) and apex b3 being the apex of insular adhesive film 13B in the lengthwise direction of release film 11 (the other end of insular adhesive film 13B in the lengthwise direction of release film 11).

For example, when first peeling part 37" is peeled off sequentially in the order of peripheral part 37A1", connection part 37C" and peripheral part 37B1", connection part 37C" preferably includes at least apex a4 of insular adhesive film 13A in the lengthwise direction of release film 11 (lower end part in the peeling direction); and more preferably includes both of apex a4 and apex b3, apex a4 being the apex of insular adhesive film 13A in the lengthwise direction of release film 11 (lower end part in the peeling direction) and apex b3 being the apex of insular adhesive film 13B in the lengthwise direction of release film 11 (upper end part in the peeling direction).

Connection part 37C" extends in the oblique direction relative to the lengthwise direction of release film 11. In FIG. 9B, unlike in the above-mentioned FIG. 8, connection part 37C" on one end side of insular adhesive film 13A in the lengthwise direction of the release film and connection part 37C" on the other end side in the lengthwise direction of the release film extend in the same direction.

Angle θ formed between the direction in which connection part 37C" extends and the lengthwise direction of release film 11 may be similar to that described above.

Width W and length L of connection part 37C" may be set in the same manner as described above. Above all, in order to easily apply peeling tension to connection part 37C", length L of connection part 37C" is preferably as small as possible, as described above. That is, length L of connection part 37C" is preferably 20 mm or less, and more preferably 10 mm or less.

FIG. 9C is a plan view illustrating another modification of the first peeling part. As illustrated in FIG. 9C, first peeling part 37''' is configured approximately the same as in FIG. 9B except that connection part 37C''' extends parallel to the lengthwise direction of the release film.

3) Step of Peeling Off First Peeling Part

The first peeling part obtained in the above-described precut step 2) is peeled off from release film 11. While the peeling method is not particularly limited, examples of the method include a method in which first peeling part 37 obtained in the precut step is wound up by winding roller 38 to peel it off from release film 11, as illustrated in FIG. 7.

As described above, none of the first peeling part of the present invention has a branching part that branches in the lengthwise direction (peeling direction) of the release film. Therefore, as illustrated in FIG. 17, peeling tension is likely to occur in the oblique direction at area X around the downstream end in the peeling direction of insular adhesive film 13A, i.e., peeling tension (shearing force) is in the oblique direction at area X of the first peeling part which is around the downstream end in the peeling direction of insular adhesive film 13A. Thus, it becomes possible to precisely peel off only the first peeling part without insular adhesive film A being peeled off together.

As described above, examples of the first peeling part include modes typified by FIGS. 8 and 9A and modes typified by FIGS. 9B and 9C, with the modes typified by FIGS. 8 and 9A being more preferred. This is because, peeling tension is likely to occur in the oblique direction at area X of the first peeling part which is around the downstream end in the peeling direction of insular adhesive film 13A; specifically, peeling tension (shearing force) is likely to occur in the oblique direction from apex a1 included in peripheral part A1 to apex b2 included in peripheral part B2, and that only the first peeling part is easily peeled off without insular adhesive film 13A being peeled off together.

Among the modes typified by FIGS. 8 and 9A, more preferred is the mode of FIG. 8 in which connection part C constituting the first peeling part extends in the oblique direction relative to the lengthwise direction of the release film. Connection part C extending in the oblique direction relative to the lengthwise direction of the release film does not include a bending part, unlike connection part C extending parallel to the lengthwise direction of the release film, and therefore is likely to convey peeling tension linearly (directly) in the oblique direction from apex a1 of insular adhesive film 13A to apex b2 of insular adhesive film 13B. Thus, it may be possible to allow the peeling tension (shearing force) to be applied in the oblique direction from apex a1 included in peripheral part A1 to apex b2 included in peripheral part B2 at area X of the first peeling part which is around the downstream end in the peeling direction of insular adhesive film 13A.

On the other hand, among the modes typified by FIGS. 9B and 9C, the mode typified by FIG. 9B is preferred. This is because, in FIG. 9B, connection part C constituting the first peeling part extends in the oblique direction relative to the lengthwise direction of the release film, and peeling tension is likely to occur in the oblique direction at area X around apex a4 (the downstream end in the peeling direction) of insular adhesive film 13A.

The method of manufacturing a laminate film of the present invention may further include, in addition to the above-described steps of 1) to 3), steps of 4) precutting the adhesive film in the laminate of the above-described step 1) to obtain one or both of a second peeling part and a third peeling part each surrounded by a cut line; and 5) peeling off the obtained one or both of second peeling part and third peeling part from the release film.

The second peeling part is provided continuously at the other widthwise end side of the release film as defined for the first peeling part. The third peeling part is provided continuously at one widthwise end side of the release film as defined for the first peeling part.

Second Embodiment 1

A laminate film of second embodiment 1 (e.g., laminate film illustrated in FIGS. 3A and 4A) of the present invention can be obtained by conducting the following additional steps together with the above-described steps of 1) to 3): steps 4-1) precutting the adhesive film in the laminate of the above-described step 1) to obtain second and third peeling parts each surrounded by cut lines (see FIGS. 10 and 11A described hereinafter); and 5-1) peeling off the second and third peeling parts from the release film.

4-1) Step of Obtaining Second and Third Peeling Parts

Figure 10:
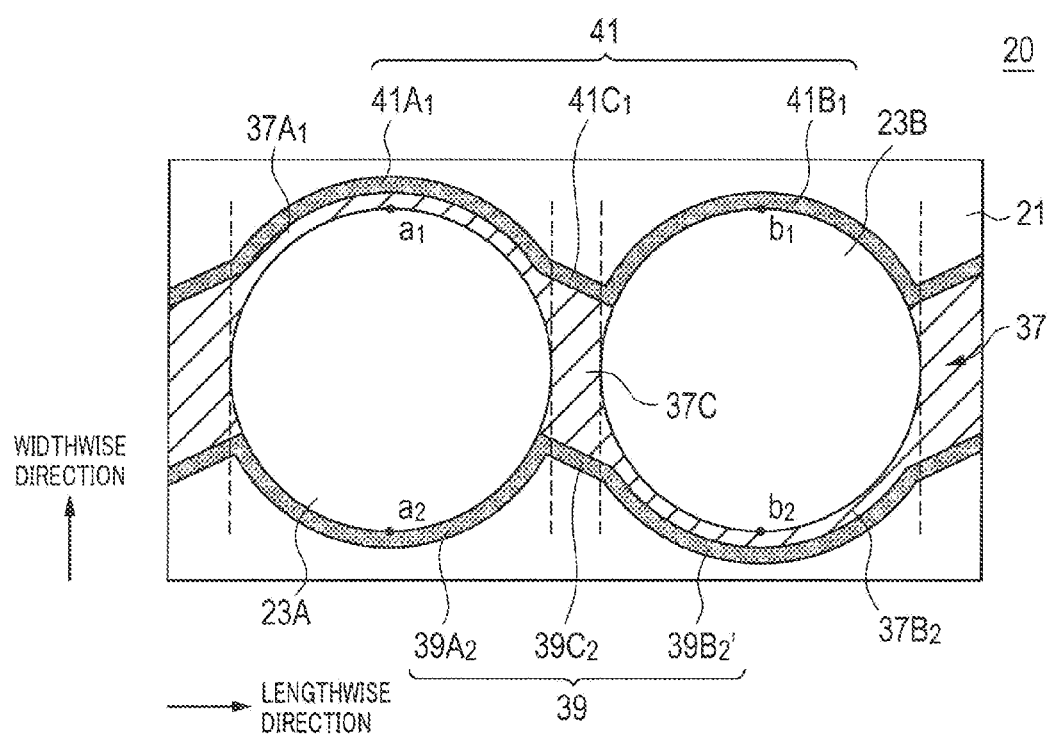
FIG. 10 is an explanatory plan view of an example of the shape of second and third peeling parts in the second embodiment of the present invention, the second and third peeling parts corresponding to the first peeling part in FIG. 8.

FIG. 10 is an explanatory plan view of an example of the shape of second and third peeling parts in the second embodiment of the present invention, which correspond to the first peeling part in FIG. 8.

As illustrated in FIG. 10, second peeling part 39 is provided continuously at the other widthwise end side of first peeling part 37. Second peeling part 39 includes peripheral part 39A2 of insular adhesive film 23A at the other widthwise end side of the release film, outer peripheral part 39B2 of insular adhesive film 23B at the other widthwise end side of the release film, and connection part 39C2 connecting these parts.

As described above, peripheral part 39A2 is a part including point a2 which is a point in the outer peripheral part of insular adhesive film 23A which is the closest to the other widthwise end of the release film, and is facing the other widthwise end of release film 21.

Outer peripheral part 39B2 is an area which is adjacent to the outer periphery of peripheral part 37B2 constituting first peeling part 37, and which is provided along the peripheral part 37B2. Width w' of outer peripheral part 39B2 is not particularly limited, and may be either the same as or different from width w of peripheral part 39A2.

Connection part 39C2 is an area which is adjacent to the other widthwise end side of the release film of connection part 37C constituting first peeling part 37, and which is provided along the connection part 37C. Connection part 39C2 connects peripheral part 39A2 and outer peripheral part 39B2.

Width w" of connection part 39C2 may be uniform or need not be uniform in its extending direction. Width w" of connection part 39C2 is not particularly limited, and, for example, may be the same as width w of peripheral part 39A2 or width w' of outer peripheral part 39B2. Width w" of connection part 39C2 either may be uniform, or need not be uniform in its extending direction.

Likewise, third peeling part 41 is provided continuously at one widthwise end side of first peeling part 37. Third peeling part 41 includes outer peripheral part 41A1 of insular adhesive film 23A at one widthwise end side of the release film, peripheral part 41B1 of insular adhesive film 23B at one widthwise end side of the release film, and connection part 41C1 connecting these parts.

Outer peripheral part 41A1 is an area which is adjacent to the outer periphery of peripheral part 37A1 constituting first peeling part 37, and which is provided along the peripheral part 37A1. Width w' of outer peripheral part 41A1 is not particularly limited, and may be either the same as or different from width w of peripheral part 41B1.

As described above, peripheral part 41B1 is a part including point b1 which is a point in the outer peripheral part of insular adhesive film 23B which is the closest to one widthwise end of release film 21, and is facing one widthwise end of release film 21.

Connection part 41C1 is an area which is adjacent to one widthwise end side of connection part 37C constituting first peeling part 37, and which is provided along the connection part 37C. Connection part 41C1 connects outer peripheral part 41A1 and peripheral part 41B1.

Width w" of connection part 41C1 is not particularly limited, and, for example, may be the same as width w of peripheral part 41B1 or width w' of outer peripheral part 41A1. The width of connection part 41C1 either may be uniform, or need not be uniform in its extending direction.

Connection part 39C2 constituting second peeling part 39 and connection part 41C1 constituting third peeling part 41 are preferably parallel to each other.

First peeling part 37, second peeling part 39 and third peeling part 41 can be obtained by using a precutting planar blade tool having a blade shape corresponding to solid lines shown on release film 21 of FIG. 10.

The shape of the second and third peeling parts is not limited to the shape illustrated in FIG. 10. For example, the shape of the second and third peeling parts may assume various shapes depending on the shape of the first peeling part (see, e.g., FIG. 11A).

Figure 11A:
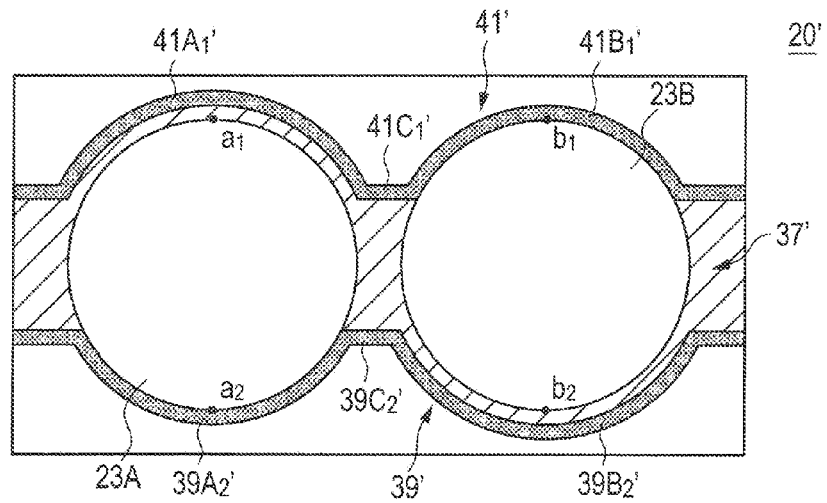
FIG. 11A is a plan view illustrating an example of the second and third peeling parts corresponding to the first peeling part in FIG. 9A.

FIG. 11A is a plan view illustrating an example of the second and third peeling parts corresponding to the first peeling part in the above-described FIG. 9A. As illustrated in FIG. 11A, second peeling part 39' and third peeling part 41' are configured in substantially the same manner as in FIG. 10 except that connection part 39C2' constituting second peeling part 39' and connection part 41C1' constituting third peeling part 41' extend in a direction parallel to the lengthwise direction of release film 21.

5-1) Step of Peeling Off Second and Third Peeling Parts

The second and third peeling parts obtained in the above-described precut step 4-1) are peeled off from release film 21, for example, in the same manner as the above-described step 3).

Second Embodiment 2

A laminate film of second embodiment 2 (e.g., laminate film illustrated in FIGS. 4B and 4C) of the present invention can be obtained by conducting the following additional steps together with the above-described steps of 1) to 3): steps 4-2) precutting the adhesive film in the laminate of the above-described step 1) to obtain a second peeling part surrounded by cut lines (see, e.g., FIGS. 11B and 11C described hereinafter); and 5-2) peeling off the second peeling part from the release film.

4-2), Step of Obtaining Second Peeling Part

Figure 11B:
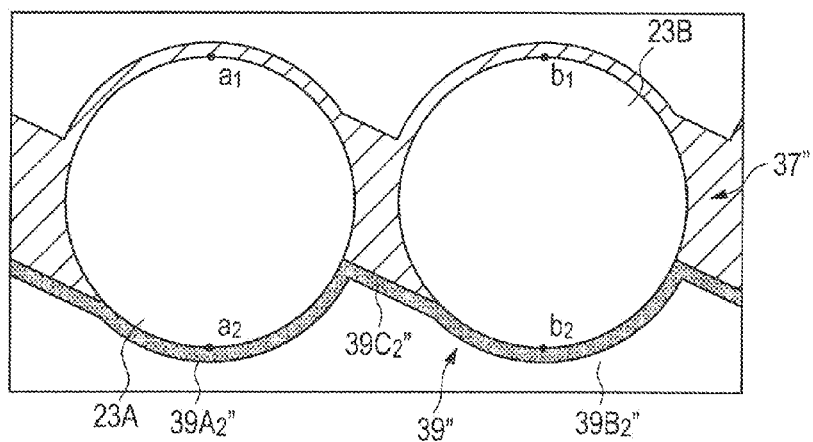
FIG. 11B is a plan view illustrating an example of the second peeling part corresponding to the first peeling part in FIG. 9B.

FIG. 11B is a plan view illustrating an example of the second peeling part corresponding to the first peeling part in the above-described FIG. 9B. As illustrated in FIG. 11B, second peeling part 39" is provided in a shape which corresponds to first peeling part 37" illustrated in FIG. 9B. Second peeling part 39" includes peripheral part 39A2" of insular adhesive film 23A at the other widthwise end side of the release film, peripheral part 39B2" of insular adhesive film 23B at the other widthwise end side of the release film, and connection part 39C2" connecting these parts.

Figure 11C:
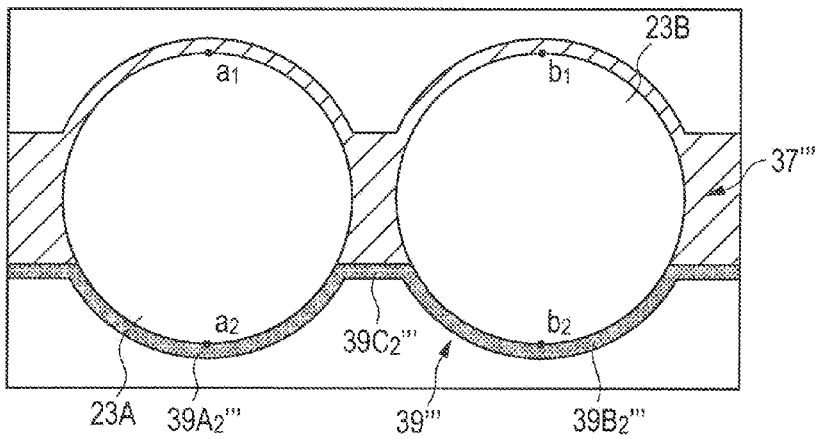
FIG. 11C is a plan view illustrating an example of the second peeling part corresponding to the first peeling part in FIG. 9C.

FIG. 11C is a plan view illustrating an example of the second peeling part corresponding to the first peeling part in the above-described FIG. 9C. As illustrated in FIG. 11C, second peeling part 39'" is provided in a shape which corresponds to first peeling part 37'" illustrated in FIG. 9C.

5-2) Step of Peeling Off Second Peeling Part

The second peeling part obtained in the above-described precut step 4-2) is peeled off from release film 21, for example, in the same manner as the above-described step 3).

As illustrated in the above-described FIG. 8, when only the first peeling part 37 is peeled off, merely a cut part is formed in a part of the outer peripheral part of insular adhesive film 13A or 13B and the insular adhesive is not surrounded by an exposed part of the release film. Therefore, in the step of attaching insular adhesive films 13A and 13B to a semiconductor wafer (see FIG. 12 described hereinafter), it is sometimes difficult to peel off insular adhesive films 13A and 13B from release film 11, and attach the insular adhesive films to the semiconductor wafer.

In contrast, in the present embodiment, not only first peeling part 37, but also, for example, both of second peeling part 39 and third peeling part 41 (see, e.g., FIG. 10), or one of second peeling part 39 and third peeling part 41

(see, e.g., FIG. 11B) is further peeled off. As a result, it becomes possible to surround most (preferably all) of the outer peripheral part of insular adhesive film 23A or 23B with the exposed part of the release film. Therefore, in the step of attaching insular adhesive film 23A or 23B to a semiconductor wafer (see FIG. 12 described hereinafter), it becomes possible to easily peel off insular adhesive film 23A or 23B from release film 21, and to easily attach the film to the semiconductor wafer. This is because peeling off of insular adhesive film 23A or 23B from the release film becomes easier when the insular adhesive film is spaced apart from a pair of side parts, as compared to the case where the insular adhesive film is in contact with the pair of side parts.

The step of obtaining the first peeling part (above-described step 2)) and the step of obtaining one or both of the second and third peeling parts (above-described step 4)) may be conducted simultaneously or sequentially. When these steps are conducted sequentially, it is preferable to conduct the step of obtaining one or both of the second and third peeling parts (above-described step 4)) after conducting the step of obtaining the first peeling part (above-described step 2)).

The step of peeling off the first peeling part (above-described step 3)) and the step of peeling off one or both of the second and third peeling parts (above-described step 5)) may be conducted simultaneously or sequentially. When these steps are conducted sequentially, it is preferable to conduct the step of peeling off one or both of the second and third peeling parts (above-described step 5)) after conducting the step of peeling off the first peeling part (above-described step 3)).

It is also possible to conduct the step of obtaining the first peeling part (above-described step 2)) and the step of obtaining one or both of the second and third peeling parts (above-described step 4)) simultaneously, and to conduct the step of peeling off at least one of the second and third peeling parts (above-described step 5)) after conducting the step of peeling off the first peeling part (above-described step 3)).

3. Method of Manufacturing Semiconductor Device

The method of manufacturing a semiconductor device of the present invention includes: 1) peeling off at least a part of a release film from a laminate film of the present invention to expose at least a part of an insular adhesive film; and 2) attaching the exposed insular adhesive film to a semiconductor wafer.

FIG. 12 is a schematic diagram illustrating an example of a step of attaching the insular adhesive film of the laminate film of the present invention to a semiconductor wafer, which step is a part of the step of manufacturing the semiconductor device of the present invention.

Figure 12A:
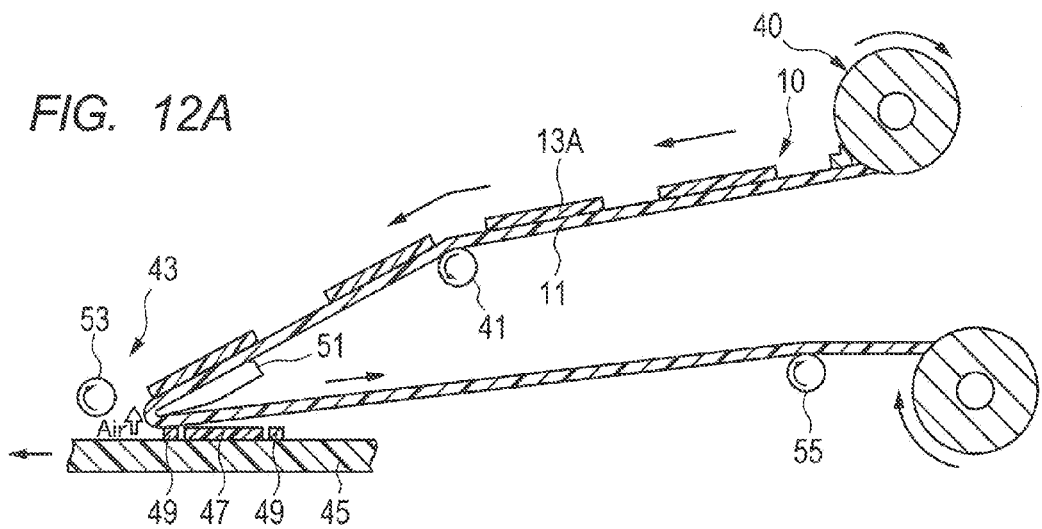
FIG. 12A is a schematic diagram illustrating an example of a step of attaching the insular adhesive film of the laminate film of the present invention to a semiconductor wafer, which step is a part of the step of manufacturing the semiconductor device of the present invention.

As illustrated in FIG. 12A, elongated laminate film 10 of the present invention is unwound from roll body 40 of the elongated laminate film. The unwound laminate film 10 is conveyed to mount part 43 by conveyor roller 41. As illustrated in FIG. 12A, release film 11 of elongated laminate film 10 functions as a carrier film of insular adhesive film 13A (or 13B).

In mount part 43, circular semiconductor wafer 47 and ring frame 49 disposed to surround the circular semiconductor wafer 47 are placed on movable stage 45.

Elongated laminate film 10 is guided to mount part 43 and wedge-shaped member 51 is pressed against elongated laminate film 10 from the rear surface of release film 11 of the laminate film 10. As a result, release film 11 is bent at an acute angle with bent axis being parallel to the widthwise direction of release film 11, and the end part of insular adhesive film 13A (or 13B) is exposed from the surface of release film 11 (formation of a peel-off point). Accordingly, a starting point for the peeling-off is formed. For easy production of the start point, air may be blown into the boundary part between release film 11 and insular adhesive film 13A (or 13B) of the part bent at an acute angle. Then, the end part of the above-mentioned exposed insular adhesive film 13A (or 13B) is disposed on the end part of its corresponding ring frame 49.

Figure 12B:
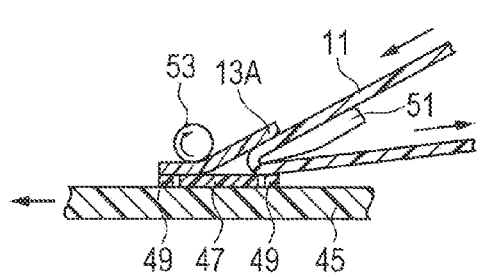
FIG. 12B is a schematic diagram illustrating an example of a step of attaching the insular adhesive film of the laminate film of the present invention to a semiconductor wafer, which step is a part of the step of manufacturing the semiconductor device of the present invention.

Next, as illustrated in FIG. 12B, while fixing the end part of ring frame 49 and the end part of insular adhesive film 13A (or 13B), wedge-shaped member 51 on which release film 11 is wound is moved away (retreated) from the end part of ring frame 49 to dispose insular adhesive film 13A (or 13B) on ring frame 49 and the entire surface of semiconductor wafer 47 surrounded thereby.

Figure 12C:
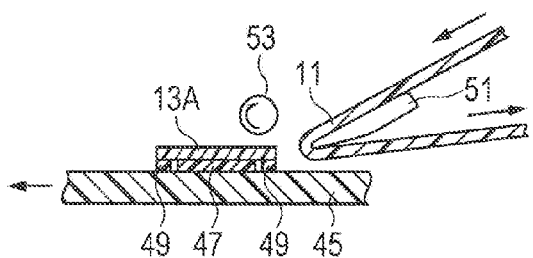
FIG. 12C is a schematic diagram illustrating an example of a step of attaching the insular adhesive film of the laminate film of the present invention to a semiconductor wafer, which step is a part of the step of manufacturing the semiconductor device of the present invention.
Figure 13A:
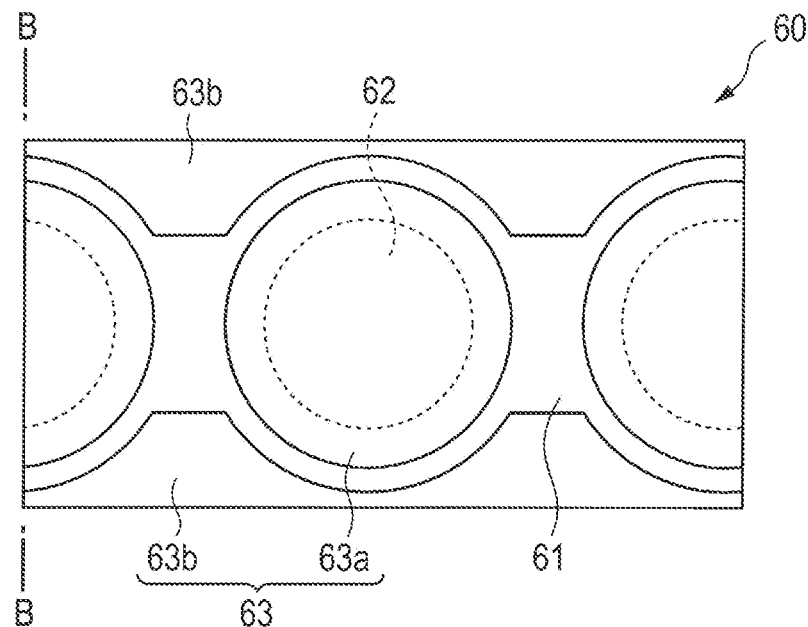
FIG. 13A is a plan view of a conventional dicing film which has been subjected to precut processing.
Figure 13B:
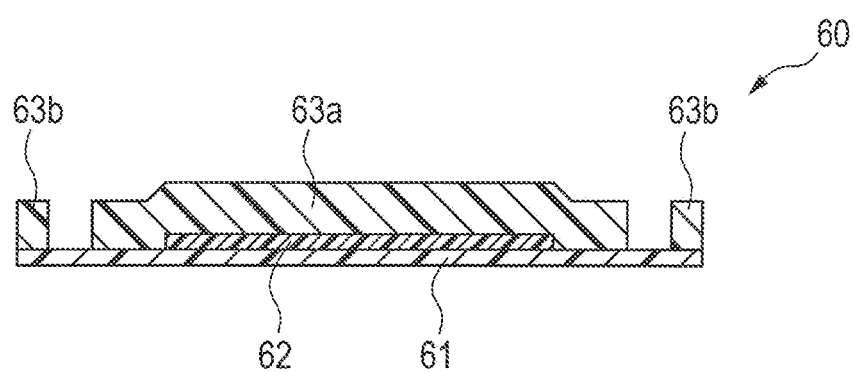
FIG. 13B is a sectional view taken along line B-B in FIG. 13A.
Figure 14:
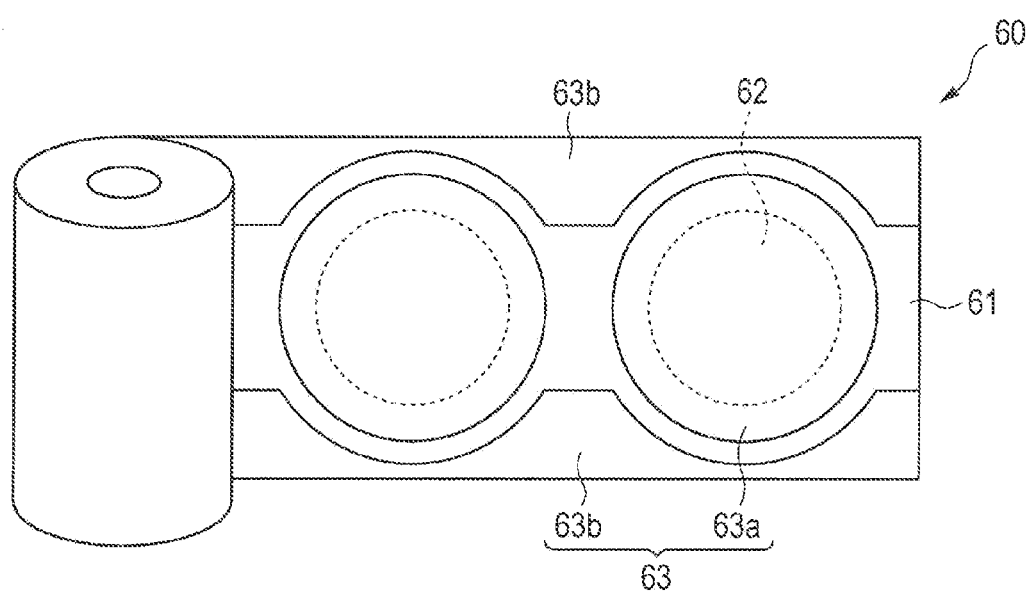
FIG. 14 is a diagram illustrating a roll body of the conventional dicing film.
Figure 15A:
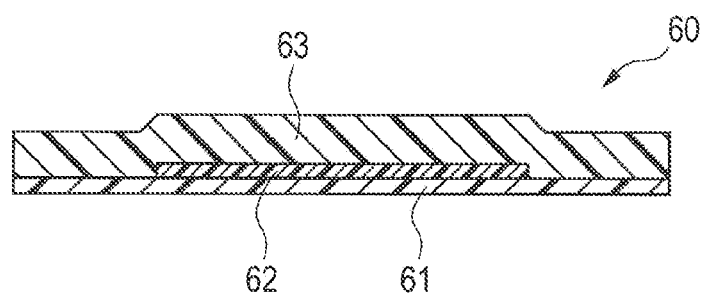
FIG. 15A is a diagram illustrating a laminate to be subjected to the precut processing.
Figure 15B:
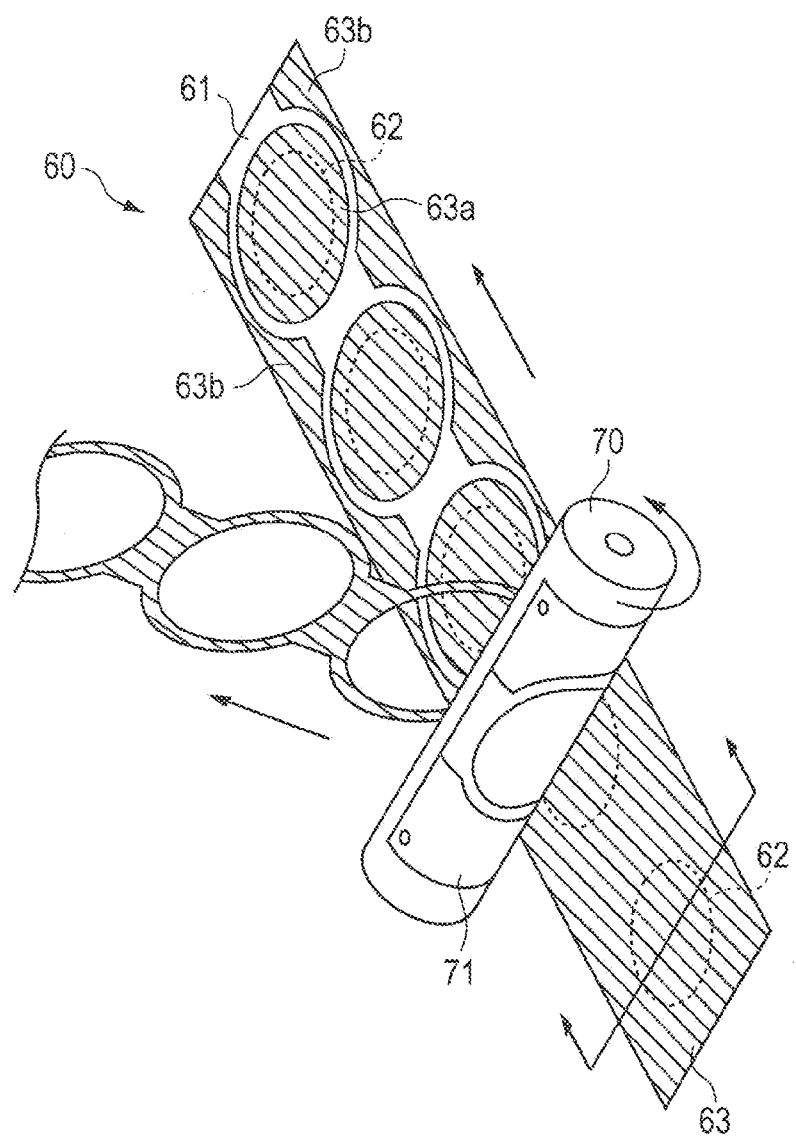
FIG. 15B is a diagram illustrating a conventional precut processing.

As illustrated in FIG. 12C, insular adhesive film 13A (or 13B) disposed on ring frame 49 and the entire surface of semiconductor wafer 47 surrounded thereby is pressed from the top by attaching roller 53 to thereby adhere together insular adhesive film 13A (or 13B) and ring frame 49, and also insular adhesive film 13A (or 13B) and the entire surface of semiconductor wafer 47. Thus obtained is semiconductor wafer 47 with an insular adhesive film being attached thereto. The insular adhesive film may be attached to the rear surface (non-circuit formation surface) of a semiconductor wafer, or to the front surface (circuit formation surface) of the semiconductor wafer, but in general, it is attached to the rear surface (non-circuit formation surface) of the semiconductor wafer.

Thereafter, release film 11 with insular adhesive film 13A (or 13B) being removed is conveyed via conveyor roller 55 to wind up into a roll (see FIG. 12A).

Through such procedures, it becomes possible to attach insular adhesive film 13A (or 13B) to semiconductor wafer 47 continuously in automated processes. Examples of an apparatus conducting such process of attaching the insular adhesive film to the semiconductor wafer include DFM-2800 manufactured by DISCO Inc. and RAD-2500 (product name) manufactured by Lintec Corporation.

As described above, the laminate film of the present invention can reduce the adhesiveness between the insular adhesive film and the release film. Therefore, as illustrated in FIG. 12A, it becomes easier to expose and peel off the end part of the insular adhesive film from the surface of the release film.

The method of manufacturing the semiconductor device of the present invention may further include the steps of: 3) dicing a semiconductor wafer with an insular adhesive film being attached to obtain a plurality of semiconductor chips (semiconductor elements); and 4) picking up the semiconductor chip by expanding the insular adhesive film 3) Dicing Step The semiconductor wafer with the insular adhesive film being attached thereto which is obtained as described above is diced (cut) to obtain semiconductor chips (semiconductor elements). Cutting means is not particularly limited, and may be a dicing saw, a laser, or the like.

The cutting depth varies depending on the layer structure of the insular adhesive film, and may be appropriately set. For example, when the insular adhesive film has the layer structure as illustrated in FIG. 5, the cutting depth may be set to such a degree as to reach the interface between substrate layer 135 and intermediate layer 133 of the insular adhesive film.

4) Picking-Up Step

Next, the insular adhesive film on which a plurality of semiconductor chips is disposed is expanded. The means for expanding the insular adhesive film is not particularly limited, and include a method of elevating the stage of an expander supporting the rear surface of the insular adhesive film and a method of drawing (expanding) the insular adhesive film in the direction parallel to the insular adhesive film surface.

Thus, it becomes possible to expand the interval between semiconductor chips obtained by dicing. In addition, expanding the insular adhesive film causes shearing stress to occur between the adhesive layer of the insular adhesive film and the semiconductor chip, thereby reducing the adhesive force between the semiconductor chip and the adhesive layer. Thus, it becomes possible to easily pick up the semiconductor chip.

When the insular adhesive film contains an UV or heat curable adhesive layer on the surface to be in contact with the semiconductor chip, the picking-up step may further include a step of UV irradiation or heating of the expanded insular adhesive film for curing the adhesive layer of the insular adhesive film. This step lowers the adhesiveness between the adhesive layer of the insular adhesive film and the semiconductor chip, thereby enabling an easy picking up of the semiconductor chip.

EXAMPLES

Hereinafter, the present invention will be described in more detail with reference to Examples. However, the technical scope of the present invention is not construed to be limited by these Examples.

1. Raw Materials for Laminate Film

1) Raw Material for Low Friction Layer

To Evolue SP2040 was blended 5% by weight of a silicone resin (BY27-002 (product name) manufactured by Dow Coning Toray Silicone Co., Ltd.), thereby preparing a raw material mixture.

2) Raw Materials for Substrate Layer

TAFMER BL4000 manufactured by Mitsui Chemicals, Inc. was prepared as a 1-butene.α-olefin copolymer (A1).

In addition, a propylene-based elastomer composition (B1) was prepared as set forth below. First, a propylene.α-olefin copolymer (b1) of propylene/ethylene/1-butene (weigh ratio of 70/10/20) was obtained in the same manner as in synthesis example 1 of paragraph [0111] of Japanese Patent No. 4945014. Then, 80 parts by weight of the propylene.α-olefin copolymer (b1) and 20 parts by weight of homo-polypropylene (b2) were kneaded together at 200° C. with a twin-screw extruder to afford the propylene-based elastomer composition (B1).

The tensile elasticity of each of the 1-butene.α-olefin copolymer (A1) and the propylene-based elastomer composition (B1) was measured by the following methods:

1) As a measurement sample, a sample film, for example, having an initial length of 140 mm, a width of 10 mm, and a thickness of 75 to 100 μm, was provided;

2) then, a tensile test was conducted under the following conditions: a measurement temperature of 25° C., a chuck-to-chuck distance of 100 mm, and a tensile rate of 50 mm/min, to thereby measure the change (mm) of the elongation of the sample; and 3) to an S-S curve (stress-strain curve) obtained above, a tangent was drawn to an initial rising point of the curve and the slope of the tangent was divided by a sectional area of the sample film, thereby obtaining a value to be used as the tensile elasticity.

Next, the 1-butene.α-olefin copolymer (A1) and the propylene-based elastomer composition (B1) produced above were mixed at a mass ratio of 60/40, thereby obtaining a mixture.

3) Raw Material for Intermediate Layer

TAFMER P0275 (registered trademark) manufactured by Mitsui Chemicals, Inc. was provided.

4) Raw Materials for Adhesive Layer (Adhesive A)

UV curable adhesive A was prepared in the below mentioned manner. That is, 48 parts by weight of ethyl acrylate, 27 parts by weight of acrylic acid-2-ethylhexyl, 20 parts by weight of methyl acrylate, 5 parts by weight of glycidyl methacrylate, and 0.5 parts by weight of benzoyl peroxide as a polymerization initiator were mixed together. Into a nitrogen-purged flask containing 65 parts by weight of toluene and 50 parts by weight of ethyl acetate was dropwise added the resultant mixture at 80° C. over 5 hours while stirring, followed by further stirring for 5 hours to allow the reaction to proceed. After completion of the reaction, the resultant solution was cooled, and 25 parts by weight of xylene, 2.5 parts by weight of acrylic acid, and 1.5 parts by weight of tetradecylbenzylammonium chloride were added to the cooled solution, and the reaction was allowed to proceed at 80° C. for 10 hours while blowing air into the flask, to thereby obtain a solution of an acrylic ester copolymer having photopolymerizable carbon-carbon double bonds introduced therein. To this solution, were added 7 parts by weight of benzoin as a photopolymerization initiator, 2 parts by weight of an isocyanate cross-linking agent (product name: OLESTER P-49-75S manufactured by Mitsui Chemicals, Inc.), and 15 parts by weight of dipentaerythritol hexaacrylate (product name: ARONIX M-400 manufactured by Toagosei Co., Ltd.) as a low molecular weight compound having 2 or more photopolymerizable carbon-carbon double bonds in a molecule, all based on 100 parts by weight of the copolymer (solid content), to thereby obtain a UV curable adhesive A.

(Adhesive B)

Adhesive B was obtained in the same manner as that for the adhesive A except that the amount of isocyanate cross-linking agent (product name: OLESTER P-49-75S manufactured by Mitsui Chemicals, Inc.) was changed to 2.5 parts by weight.

(Adhesive C)

Adhesive C was obtained in the same manner as that for the adhesive A except that the amount of the isocyanate cross-linking agent (product name: OLESTER P-49-75S manufactured by Mitsui Chemicals, Inc.) was changed to 3 parts by weight.

5) Release Film

Release film A: Purex A54 manufactured by Teijin Limited (thickness 38 μm)

Release film B: SP-PET L31 manufactured by Mitsui Chemicals Tohcello, Inc. (thickness 31 μm)

2. Production of Elongated Laminate

Production Example 1

The above-described raw materials for the low friction layer, substrate layer and intermediate layer were individually charged into an extruder having full-flight screws, to melt-knead the raw materials. The melt products of the raw materials for the substrate layer, intermediate layer and low friction layer were laminated in a multilayer die, and subjected to coextrusion molding. The extrusion temperature was set at 230° C. Thus, a three-layer film of low friction layer/substrate layer/intermediate layer was obtained.

The intermediate layer of the obtained three-layer film was coated with the above-mentioned adhesive A, and then dried to form an adhesive layer. Subsequently, the above-mentioned release film B was laminated on the adhesive layer, thereby affording a laminate containing a four-layer film (adhesive film) composed of adhesive layer/intermediate layer/substrate layer/low friction layer laminated in this order, and a release film B provided on the adhesive layer. The thickness of each layer of the laminate composed of the low friction layer/substrate layer/intermediate layer/adhesive layer was 10 μm/60 μm/50 μm/5 μm (total: 125 μm), respectively.

Production Examples 2 to 6

Laminates were produced in substantially the same manner as in Production Example 1 except that the type of the adhesive layer or the type of the release film was changed as shown in Table 1 or 2.

The adhesive force of the adhesive layer of the obtained laminate and the peel strength between the adhesive layer and the release film were measured by the methods as set forth below.

(Adhesive Force)

The adhesive force of the adhesive layer of the obtained laminate was measured under the environment such that the temperature was 23° C. and a relative humidity was 50%, in accordance with an adhesive sheet test method as set forth in JIS Z0237. Specifically, the obtained laminate was employed as a test piece with a width of 25 mm. A release film was peeled off from the test piece, and the exposed adhesive layer was attached to a SUS-304-BA plate while applying pressure to the SUS-BA plate with a rubber roll of about 2-kg, and the test piece was placed under a constant environment at 23° C. and a relative humidity of 50% for 60 minutes. Then, the adhesive force necessary for peeling off the test piece in a direction 180° to the SUS-BA plate at a peeling rate of 300 mm/min was measured. The measurement of the adhesive force was conducted twice, and the average value was set as the "adhesive force" (N/25 mm).

(Peeling Strength)

The peel strength between the obtained insular adhesive film and release film was measured under the environment such that the temperature is 23° C. and the relative humidity is 50%, in accordance with the adhesive sheet test method as set forth in JIS Z0237. Specifically, the test method was conducted as follows:
1) The obtained insular adhesive film was attached to the release film while applying pressure to the release film with a rubber roll of about 2-kg, and then the resultant film was cut out into a width of 50 mm to give a test piece. The test piece was placed for 30 minutes under the constant environment such that the temperature is 23° C. and the relative humidity is 50%.
2) Next, clips were attached respectively to the insular adhesive film and the release film of the test piece, and the force necessary for peeling off the films from each other by pulling the films in a direction 180° from each other at a peeling rate of 300 mm/min was measured. The measurement of the peel strength was conducted twice, and the average of the measured peel strength was defined as the "peel strength" (g/50 mm).

3. Method of Manufacturing Laminate Film

Example 1

The elongated laminate obtained in Production Example 1 was subjected to precut processing into the shape as illustrated in FIG. 10 using a magnet cylinder having a planar blade tool for precut processing, thereby obtaining a first peeling part, a second peeling part, and a third peeling part. Then, the first peeling part, the second peeling part, and the third peeling part were peeled off and removed to afford a laminate film as illustrated in FIG. 3A. The line connecting the centers of a plurality of insular adhesive films was made to be in parallel with the lengthwise direction of the release film.

In FIG. 10, the diameter of each of insular adhesive films 23A and 23B was made to match a 12-inch ring frame (370 mm). The connection part 37C constituting first peeling part 37 was made to extend in a 23° direction relative to the lengthwise direction of the release film. Length L of connection part 37C was set at 10 mm, and width W thereof was set at 210 mm. The width w of each of peripheral parts 37A1 and 37B2 constituting first peeling part 37 was set at 3 mm.

Width w of peripheral part 39A2 constituting second peeling part 39 was set at 6 mm; width w' of outer peripheral part 39B2 was set at 3 mm; and width w" of connection part 39C2 was set at 3 mm. Width w' of outer peripheral part 41A1 constituting third peeling part 41 was set at 3 mm; width w of peripheral part 41B1 was set at 6 mm; and width w" of connection part 41C1 was set at 3 mm.

Examples 2 to 6

A laminate film was produced in substantially the same manner as in Example 1 except that the elongated laminate obtained in Production Example 1 was changed to the elongated laminates obtained in Production Examples 2 to 6.

Comparative Example 1

A laminate film was obtained in substantially the same manner as in Example 1 except that the elongated laminate obtained in Production Example 1 was subjected to a precut processing into a conventional shape as illustrated in FIG. 16, thereby forming a peeling part.

That is, the connection part of the peeling part was made to extend in a direction parallel (0° C.) to the lengthwise direction of the release film. The length and width of the connection part of the peeling part were similar to the length and width of connection part 37C constituting first peeling part 37 of Example 1.

Comparative Examples 2 to 6

A laminate film was obtained in substantially the same manner as in Example 1 except that the elongated laminate obtained in Production Example 1 was changed to the elongated laminates obtained in Production Examples 2 to 6.

The precut processability of the adhesive film of the laminate film was evaluated by the method set forth below.

(Precut Processability)

In Examples 1 to 6, the adhesive film of the laminate film was precut processed into two circular pieces per revolution of a roller; and, in Comparative Examples 1 to 6, the adhesive film was precut processed into one circular piece per revolution of a roller, thereby precutting 10 circular pieces continuously. Then, the peeling state after the removal of the peeling part was evaluated in accordance with the following standards:

1: hi all 10 pieces, no peeling defect occurred.
2: In at least 1 piece and less than 3 pieces, a peeling defect occurred.
3: In at least 3 pieces, a peeling defect occurred.
(Attachability to Wafer)

The attachability of the laminate film to the wafer (i.e., easiness of peel-off point formation) was evaluated using DFM-2800 manufactured by DISCO Inc. The term "formation of peel-off point" means peeling off of an insular adhesive film from a release film in a laminate film.

1: In all 10 pieces, formation of peel-off point was successful, and no defect occurred during the attachment of the film to the wafer.
3: In at least 1 piece, formation of peel-off point was unsuccessful, and a defect occurred during the attachment of the film to the wafer.

The evaluation results of Examples 1 to 6 are shown in Table 1, and the evaluation results of Comparative Examples 1 to 6 are shown in Table 2.

with even necessary parts being peeled off. From these results, it is apparent that the precut processability may be enhanced by employing the shape of the present invention for the shape of the peeling part, particularly when the peel strength (adhesiveness between the release film and the adhesive layer) of the laminate film is low.

In addition, from the comparison between Examples 1 to 3 and Examples 4 to 6, it is apparent that the lowering of the peel strength (adhesiveness between the release film and the adhesive layer) of the laminate film results in easier peeling off of the insular adhesive film from the release film, and also enhances the attachability of the insular adhesive film to the wafer.

This application is entitled to and claims the benefit of Japanese Patent Application No. 2013-064553, filed on Mar. 26, 2013, the disclosures of which including the specification, drawings and abstract are incorporated herein by reference in its entirety.

INDUSTRIAL APPLICABILITY

According to the present invention, it is possible to provide a method of manufacturing a laminate film which is precut processed precisely into a predetermined shape.

TABLE 1

| Film Configuration | | | Ex. 1 | Ex. 2 | Ex. 3 | Ex. 4 | Ex. 5 | Ex. 6 |
|---|---|---|---|---|---|---|---|---|
| | 1) Low Friction Layer | | Evolue SP2040 + Silicone Resin | | | Evolue SP2040 + Silicone Resin | | |
| | 2) Substrate Layer | Type | 1-Butene·α-Olefin (A1)/Propylene-Based Elastomer Composition (B1) = 60/40 | | | 1-Butene·α-Olefin (A1)/Propylene-Based Elastomer Composition (B1) = 60/40 | | |
| | | (A1) Tensile Elasticity (MPa) | 430 | | | 430 | | |
| | | (B1) Tensile Elasticity (MPa) | 42 | | | 42 | | |
| | 3) Intermediate Layer | | TAFMER P0275 | | | TAFMER P0275 | | |
| | 4) Adhesive Layer | Type | Adhesive A | Adhesive B | Adhesive C | Adhesive A | Adhesive B | Adhesive C |
| | | Adhesive Force (N/25 mm) | 3.1 | 2.8 | 2.5 | 3.1 | 2.8 | 2.5 |
| | 5) Release Film | | Separator B | Separator B | Separator B | Separator A | Separator A | Separator A |
| | | Peel Strength (g/50 mm) | 29 | 19 | 12 | 94 | 52 | 40 |
| Evaluation | Precut characteristics | | 1 | 1 | 1 | 1 | 1 | 1 |
| | Attachability (Peel-Off Point Formation) | | 1 | 1 | 1 | 3 | 3 | 3 |

TABLE 2

| Film Configuration | | | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|
| | 1) Low Friction Layer | | Evolue SP2040 + Silicone Resin | | | Evolue SP2040 + Silicone Resin | | |
| | 2) Substrate Layer | Type | 1-Butene·α-Olefin (A1)/Propylene-Based Elastomer Composition (B1) = 60/40 | | | 1-Butene·α-Olefin (A1)/Propylene-Based Elastomer Composition (B1) = 60/40 | | |
| | | (A1) Tensile Elasticity (MPa) | 430 | | | 430 | | |
| | | (B1) Tensile Elasticity (MPa) | 42 | | | 42 | | |
| | 3) Intermediate Layer | | TAFMER P0275 | | | TAFMER P0275 | | |
| | 4) Adhesive Layer | Type | Adhesive A | Adhesive B | Adhesive C | Adhesive A | Adhesive B | Adhesive C |
| | | Adhesive Force (N/25 mm) | 3.1 | 2.8 | 2.5 | 3.1 | 2.8 | 2.5 |
| | 5) Release Film | | Separator B | Separator B | Separator B | Separator A | Separator A | Separator A |
| | | Peel Strength (g/50 mm) | 29 | 19 | 12 | 94 | 52 | 40 |
| Evaluation | Precut characteristics | | 3 | 3 | 3 | 2 | 2 | 2 |
| | Attachability (Peel-Off Point Formation) | | 1 | 1 | 1 | 3 | 3 | 3 |

According to the peeling methods of Examples 1 to 6 in which the shape of the peeling part is configured as illustrated in FIG. 10, the film was successfully precut into a predetermined circular shape without causing any peeling off of a necessary part. On the other hand, in the peeling methods of Comparative Examples 1 to 6 (in particular, Comparative Examples 1 to 3) in which the shape of the peeling part is configured to be the conventional shape, the film could not be precut into a predetermined circular shape

REFERENCE SIGNS LIST 10, 10', 10", 10''' Laminate film
20, 20', 20", 20''' Laminate film
11, 21 Release film
13 (Elongated) adhesive film
13A, 13B, 23A, 23B Insular adhesive film
15-1, 15-1', 15-1", 15-1''' Side part
15-2, 15-2', 15-2", 15-2''' Side part 17, 17a, 17b, 17c Exposed part
25-1, 25-1', 25-1'', 25-1''' Side part
25-2, 25-2', 25-2'', 25-2''' Side part
27, 27a, 27b, 27c Exposed part
30 Laminate
33 Precutting planar blade tool
35 Magnet cylinder
37 First peeling part
37A1, 37B2 Peripheral part (of first peeling part)
37C Connection part (of first peeling part)
W Width of connection part 37C
w Width of peripheral part 37A1
L Length of connection part 37C
39 Second peeling part
39A2 Peripheral part (of second peeling part)
39B2 Outer peripheral part (of second peeling part)
39C2 Connection part (of second peeling part)
41 Third peeling part
41A1 Outer peripheral part (of third peeling part)
41B1 Peripheral part (of third peeling part)
41C1 Connection part (of third peeling part)
41, 55 Conveyor roller
43 Mount part
40 Roll body of laminate film
45 Stage
47 Semiconductor wafer
49 Ring frame
51 Wedge-shaped member
53 Attaching roller
131 Adhesive layer
133 Intermediate layer
135 Substrate layer
137 Low friction layer
θ Angle formed
X Area
a1, a2, a4, b1, b2, b3 apex (of insular adhesive film)
O Center (of insular adhesive film)

The invention claimed is:

1. A method of manufacturing a laminate film comprising an elongated release film and a plurality of insular adhesive films, the insular adhesive film being either an insular adhesive film A or an insular adhesive film B which is adjacent to each other on the release film along a lengthwise direction thereof, the method comprising:
obtaining an elongated laminate comprising the elongated release film and an elongated adhesive film,
precutting the adhesive film in the laminate to thereby obtain a first peeling part surrounded by a cut line, and
peeling off the first peeling part from the release film, wherein:
the first peeling part includes a peripheral part A1 of the insular adhesive film A at one widthwise end side of the release film, a peripheral part B2 of the insular adhesive film B at the other widthwise end side of the release film and a connection part C connecting the peripheral part A1 and the peripheral part B2, but does not include a peripheral part A2 of the insular adhesive film A at the other widthwise end side of the release film and a peripheral part B1 of the insular adhesive film B at the one widthwise end side of the release film, or alternatively
the first peeling part includes the peripheral part A1 of the insular adhesive film A at the one widthwise end side of the release film, the peripheral part B1 of the insular adhesive film B at the one widthwise end side of the release film and a connection part C connecting the peripheral part A1 and the peripheral part B1, but does not include the peripheral part A2 of the insular adhesive film A at the other widthwise end side of the release film and the peripheral part B2 of the insular adhesive film B at the other widthwise end side of the release film.

2. The method of manufacturing a laminate film according to claim 1, wherein
the first peeling part includes a peripheral part A1 of the insular adhesive film A at one widthwise end side of the release film, a peripheral part B2 of the insular adhesive film B at the other widthwise end side of the release film and the connection part C connecting the peripheral part A1 and the peripheral part B2, but does not include the peripheral part A2 of the insular adhesive film A at the other widthwise end side of the release film and the peripheral part B1 of the insular adhesive film B at the other widthwise end side of the release film.

3. The method of manufacturing a laminate film according to claim 2, wherein:
the first peeling part is peeled off along the lengthwise direction of the release film in an order of the peripheral part A1, the connection part C and the peripheral part B2, and
the connection part C constituting the first peeling part is in contact with the insular adhesive film A at a lower end thereof in the peeling direction of the peeling part.

4. The method of manufacturing a laminate film according to claim 2, wherein the connection part C extends in an oblique direction relative to the lengthwise direction of the release film.

5. The method of manufacturing a laminate film according to claim 1, wherein a line connecting centers of the insular adhesive films is parallel to the lengthwise direction of the release film.

6. The method of manufacturing a laminate film according to claim 2, further comprising:
precutting the adhesive film in the laminate to thereby obtain a second peeling part surrounded by a cut line, and
peeling off the second peeling part from the release film, wherein:
the second peeling part is provided at the other widthwise end side of the release film as defined for the first peeling part, and includes a peripheral part A2 of the insular adhesive film A at the other widthwise end side of the release film, an outer peripheral part B2' provided adjacent to the outer periphery of a peripheral part B2 of the insular adhesive film B at the other widthwise end side of the release film and a connection part C2 connecting the peripheral part A2 and the outer peripheral part B2'.

7. The method of manufacturing a laminate film according to claim 2, further comprising:
precutting the adhesive film in the laminate to thereby obtain a third peeling part surrounded by a cut line, and
peeling off the third peeling part from the release film, wherein:
the third peeling part is provided at the one widthwise end side of the release film as defined for the first peeling part, and includes an outer peripheral part A1' provided adjacent to the outer periphery of a peripheral part A1 of the insular adhesive film A at the one widthwise end side of the release film, a peripheral part B1 of the insular adhesive film B at the one widthwise end side of the release film and a connection part C1 connecting the outer peripheral part A1' and the peripheral part B1.

8. The method of manufacturing a laminate film according to claim 1, wherein the insular adhesive film has a circular shape.

9. The method of manufacturing a laminate film according to claim 1, wherein the laminate film further comprises a side part which is surrounding an outer periphery of the plurality of insular adhesive films and which is provided continuously along the lengthwise direction of the release film.

10. The method of manufacturing a laminate film according to claim 1, wherein a peel strength between the release film and the insular adhesive film is 1 to 35 g/50 mm.

11. The method of manufacturing a laminate film according to claim 1, wherein the insular adhesive film is for attaching to a semiconductor wafer.

12. The method of manufacturing a laminate film according to claim 1, wherein:
the insular adhesive film comprises an expandable substrate layer which contains:
a 1-butene.α-olefin copolymer (A) having a tensile elasticity of 100 to 500 MPa at 23° C., and
a propylene-based elastomer composition (B) containing a propylene.α-olefin copolymer (b1) and having a tensile elasticity of 8 to 500 MPa at 23° C.,
a content of the propylene-based elastomer composition (B) is 30 to 70 parts by weight based on 100 parts by weight of a total of the 1-butene.α-olefin copolymer (A) and the propylene-based elastomer composition (B).

13. The method of manufacturing a laminate film according to claim 1, wherein:
the insular adhesive film further comprises an adhesive layer provided on a surface which is in contact with the release film, and
adhesive force of the adhesive layer measured in accordance with JIS Z0237 is 0.1 to 10 N/25 mm, the measurement being made by attaching the adhesive layer to a surface of a SUS-304-BA plate, allowing to stand still for 60 minutes and peeling off the adhesive layer from the surface of the SUS-304-BA plate.

14. A laminate film comprising an elongated release film and a plurality of insular adhesive films, the insular adhesive film being either an insular adhesive film A or an insular adhesive film B which is adjacent to each other on the release film along a lengthwise direction thereof,
the laminate film further comprising an exposed part of the release film which is provided between the insular adhesive film A and the insular adhesive film B,
wherein the exposed part of the release film extends in an oblique direction relative to the lengthwise direction of the release film.

15. A laminate film comprising an elongated release film and a plurality of insular adhesive films, the insular adhesive film being either an insular adhesive film A or an insular adhesive film B which is adjacent to each other on the release film along a lengthwise direction thereof,
the laminate film further comprising an exposed part of the release film which is provided between the insular adhesive film A and the insular adhesive film B,
wherein a surface of the exposed part of the release film has a cut mark extending in an oblique direction relative to the lengthwise direction of the release film.

16. The laminate film according to claim 14, wherein the exposed part is in contact with at least one or both of one end of the insular adhesive film A in the lengthwise direction of the release film and the other end of the insular adhesive film B in the lengthwise direction of the release film.

17. The laminate film according to claim 14, wherein a line connecting centers of the insular adhesive films is parallel to the lengthwise direction of the release film.

18. The laminate film according to claim 14, wherein the insular adhesive film has a circular shape.

19. The laminate film according to claim 14, wherein a peel strength between the release film and the insular adhesive film is 1 to 35 g/50 mm.

20. The laminate film according to claim 14, wherein the insular adhesive film is for attaching to a semiconductor wafer.

21. The laminate film according to claim 14, wherein:
the insular adhesive film comprises an expandable substrate layer which contains:
a 1-butene.α-olefin copolymer (A) having a tensile elasticity of 100 to 500 MPa at 23° C., and
a propylene-based elastomer composition (B) containing a propylene.α-olefin copolymer (b1) and having a tensile elasticity of 8 to 500 MPa at 23° C.,
a content of the propylene-based elastomer composition (B) is 30 to 70 parts by weight based on 100 parts by weight of a total of the 1-butene.α-olefin copolymer (A) and the propylene-based elastomer composition (B).

22. The laminate film according to claim 14, wherein:
the insular adhesive film further comprises an adhesive layer on a surface which is in contact with the release film, and
adhesive force of the adhesive layer measured in accordance with JIS Z0237 is 0.1 to 10 N/25 mm, the measurement being made by attaching the adhesive layer to a surface of a SUS-304-BA plate, allowing to stand still for 60 minutes and peeling off the adhesive layer from the surface of the SUS-304-BA plate.

23. A method of manufacturing a semiconductor device, comprising:
peeling off at least a part of a release film from the laminate film according to claim 14 to thereby obtain an insular adhesive film having at least one exposed part thereof; and
attaching the insular adhesive film having at least one exposed part thereof to a semiconductor wafer.

24. The method of manufacturing a semiconductor device according to claim 23, further comprising:
dicing the semiconductor wafer to obtain a semiconductor chip; and
picking up the semiconductor chip by expanding the insular adhesive film.

* * * * *